US009618592B2

(12) United States Patent
Kawamura et al.

(10) Patent No.: US 9,618,592 B2
(45) Date of Patent: Apr. 11, 2017

(54) MAGNETIC RESONANCE IMAGING DEVICE WITH VIBRATION SUPPRESSION

(75) Inventors: Takeshi Kawamura, Tokyo (JP); Yukinobu Imamura, Tokyo (JP); Mitsushi Abe, Tokyo (JP); Takuro Honda, Chiba (JP); Hiroyuki Takeuchi, Chiba (JP)

(73) Assignee: Hitachi, Ltd., Tokyo (JP)

( * ) Notice: Subject to any disclaimer, the term of this patent is extended or adjusted under 35 U.S.C. 154(b) by 523 days.

(21) Appl. No.: 14/237,190

(22) PCT Filed: Aug. 10, 2012

(86) PCT No.: PCT/JP2012/070458
§ 371 (c)(1),
(2), (4) Date: Feb. 5, 2014

(87) PCT Pub. No.: WO2013/046957
PCT Pub. Date: Apr. 4, 2013

(65) Prior Publication Data
US 2014/0210476 A1    Jul. 31, 2014

(30) Foreign Application Priority Data
Sep. 30, 2011    (JP) ................. 2011-218091

(51) Int. Cl.
*G01V 3/00* (2006.01)
*G01R 33/389* (2006.01)
(Continued)

(52) U.S. Cl.
CPC ....... *G01R 33/389* (2013.01); *G01R 33/3854* (2013.01); *G01R 33/56518* (2013.01); *G01R 33/4215* (2013.01)

(58) Field of Classification Search
CPC .............. G01R 33/389; G01R 33/3854; G01R 33/56518; G01R 33/4215
(Continued)

(56) References Cited

U.S. PATENT DOCUMENTS 4,456,881 A * 6/1984 Compton ................. H01F 7/20
324/309
4,686,473 A * 8/1987 Chesneau ........ G01R 33/34076
324/319
(Continued)

FOREIGN PATENT DOCUMENTS

| JP | 2002-102205 A | 4/2002 |
| JP | 2004-130052 A | 4/2004 |
| JP | 2006-149722 A | 6/2006 |

*Primary Examiner* — Susan Lee
(74) *Attorney, Agent, or Firm* — Mattingly & Malur, PC

(57) ABSTRACT

A device includes: a static magnetic field generating device including static magnetic field generating sources generating a homogeneous magnetic field in a space; gradient magnetic field generating sources superimposing a gradient magnetic field on the homogeneous magnetic field, and conductor rings arranged between the static magnetic field generating sources and the gradient magnetic field generating sources in a pair of arranging regions on both sides in a direction of the homogeneous magnetic field in a region where the homogeneous magnetic field is generated (imaging region), respectively, the conductor rings being separated from each other and making a pair. The conductor rings are mechanically connected to the gradient magnetic field generating device or the static magnetic field generating device. This provides an MRI device 1 capable of reduction in vibration with suppression of the image quality deterioration of the tomographic images.

11 Claims, 11 Drawing Sheets

(51) Int. Cl.
*G01R 33/385* (2006.01)
*G01R 33/565* (2006.01)
*G01R 33/421* (2006.01)

(58) Field of Classification Search
USPC ...................................................... 324/322
See application file for complete search history.

(56) References Cited

U.S. PATENT DOCUMENTS

| | | | | |
|---|---|---|---|---|
| 4,751,464 A * | 6/1988 | Bridges | .............. | G01R 33/3678 324/318 |
| 4,929,881 A * | 5/1990 | Yabusaki | ......... | G01R 33/34046 324/318 |
| 5,378,989 A * | 1/1995 | Barber | ................ | G01R 33/385 324/318 |
| 5,463,364 A * | 10/1995 | Muller | ............... | G01R 33/3806 324/319 |
| 6,294,972 B1 * | 9/2001 | Jesmanowicz | ..... | G01R 33/3875 324/318 |
| 6,326,788 B1 | 12/2001 | Mulder et al. | | |
| 6,369,570 B1 * | 4/2002 | Wong | ................ | G01R 33/34046 324/307 |
| 6,418,336 B1 * | 7/2002 | Kimmlingen | ...... | G01R 33/3852 324/318 |
| 6,501,275 B1 | 12/2002 | Westphal | | |
| 6,577,125 B2 * | 6/2003 | Prammer | ................ | G01V 3/32 324/303 |
| 7,417,434 B2 * | 8/2008 | Overweg | ......... | G01R 33/34046 324/318 |
| 7,518,370 B2 * | 4/2009 | Huang | ............... | G01R 33/3804 324/319 |
| 8,134,368 B2 * | 3/2012 | Timinger | ........... | G01R 33/3815 324/318 |
| 2006/0113997 A1 | 6/2006 | Miyamoto | | |
| 2008/0094062 A1 | 4/2008 | Edelstein et al. | | |
| 2012/0032679 A1 * | 2/2012 | Brereton | ............... | G01R 33/385 324/322 |
| 2012/0169341 A1 * | 7/2012 | McKinnon | ............ | A61B 6/037 324/318 |
| 2012/0253174 A1 * | 10/2012 | Popescu | ................ | A61B 6/037 600/411 |

* cited by examiner

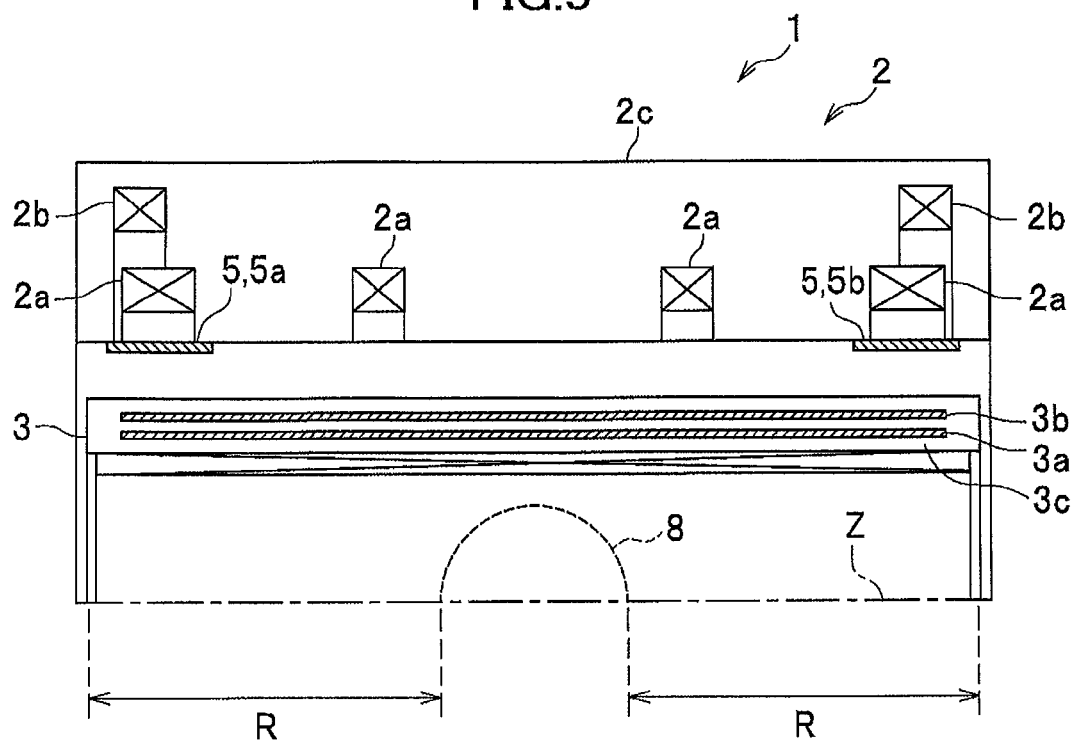
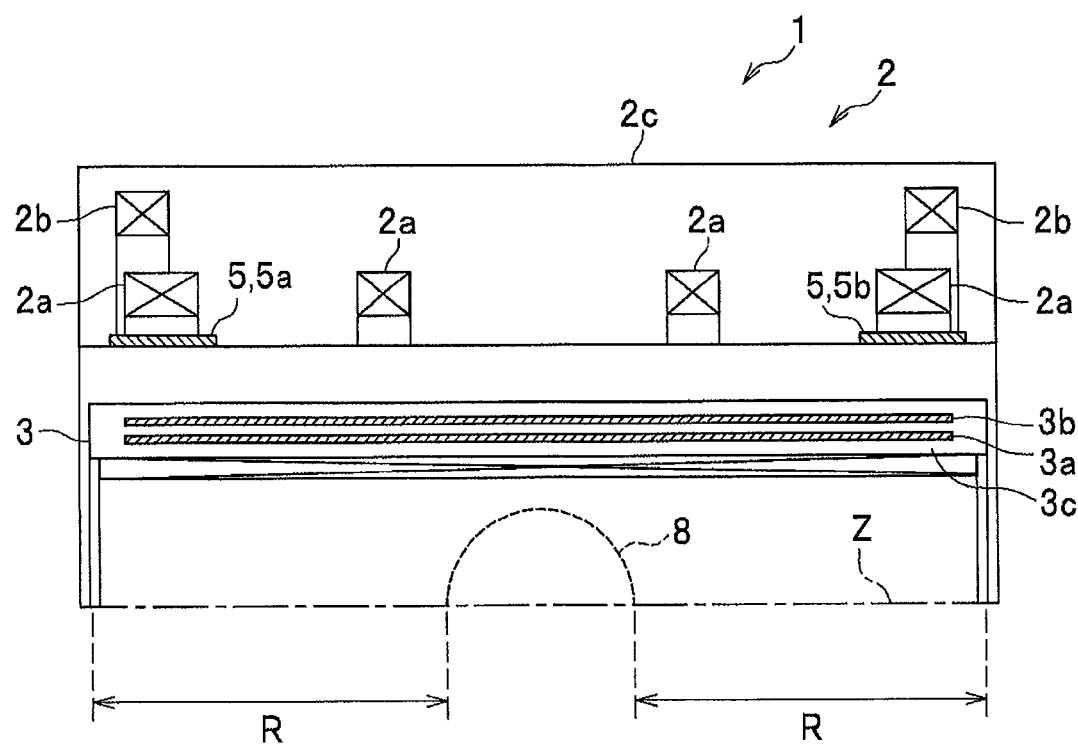

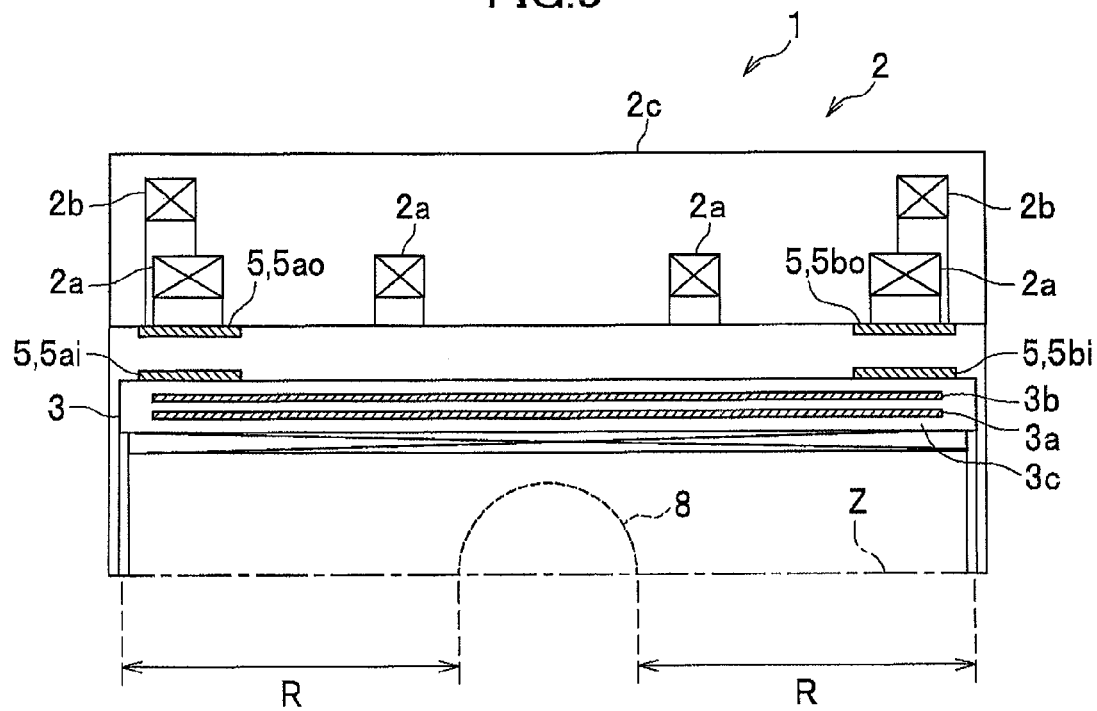
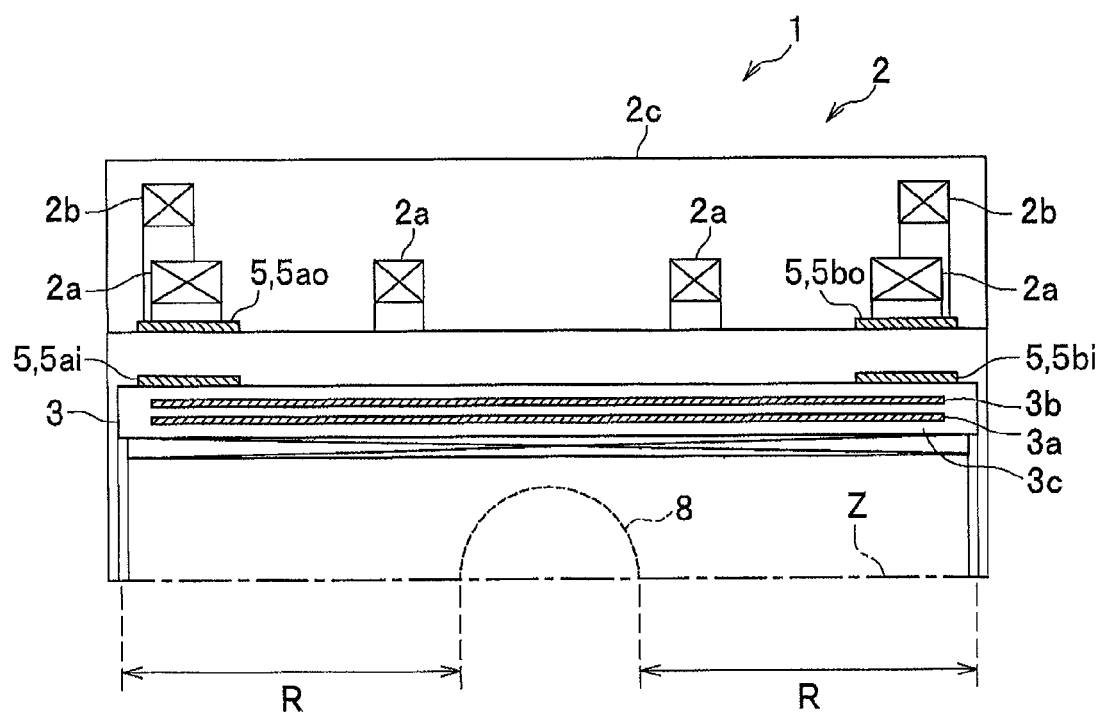

MAGNETIC RESONANCE IMAGING DEVICE WITH VIBRATION SUPPRESSION

TECHNICAL FIELD

The present invention relates to a magnetic resonance imaging (hereinafter referred to as MRI: Magnetic Resonance Imaging) device including a static magnetic field generating device and a gradient magnetic field generating device.

BACKGROUND ART

The MRI device obtains a magnetic resonance image (tomographic image) representing physical characteristics of a target body placed in an imaging space using the nuclear magnetic resonance phenomenon of nucleus. Generally, the MRI device includes a static magnetic field generating device having a static magnetic field generating source for generating a homogeneous magnetic field (static magnetic field) in a photographing space, a radiation coil for generating a high frequency electromagnetic waves for generating magnetic nuclear resonance in atomic nucleuses of biotissue of the target body, a receiving coil for detecting the nuclear magnetic resonance signal generated by the magnetic nuclear resonance, a gradient magnetic field generating device having a gradient magnetic field generating source for generating a gradient magnetic field having linear variation which is superimposed on the homogeneous magnetic field to provide positional information to the nuclear magnetic response signal. In photographing with the MRI device, the gradient magnetic field generating device magnetically excites nuclear spins at the Larmor frequency in the target body as a result of superimposing the linear gradient magnetic field in the X, Y, and Z axis directions in the target body placed in the homogenous magnetic field according to a desired pulse sequence. In accordance with the excitation, a magnetic resonance signal can be detected, and a magnetic resonance image of the target body, for example, a two-dimensional tomographic image is reconstructed.

In the gradient magnetic generating device and the static magnetic generating device vibrations may occur. The vibrations generated in these devices may be supposed to be a cause for deterioration of the tomographic image and sound noises around the MRI devices. There is a proposed prior art regarding a vibration suppressing method of the MRI device in which a magnetic field leaked from a gradient magnetic field generating source to a side of the static magnetic field generating device is shielded by installing an electric conductor plate which encloses the gradient magnetic field generating device. This reduces eddy currents and Lorentz forces generated in the static magnetic field generating device (see, for example, Patent DOCUMENT 1) to reduce sound noise of the static magnetic field generating device. In addition, there is proposed a technology in which high frequency components in the gradient magnetic field are completely shielded by hard connecting an electric conductor, having a cylindrical shape, surrounding the gradient magnetic field to the gradient magnetic field generating device to reduce the vibrations of the static magnetic field of the static magnetic field generating device (see Patent document 2).

PRIOR ART DOCUMENT

Patent Document

PATENT DOCUMENT 1 U.S. Pat. No. 6,326,788B1
PATENT DOCUMENT 2 U.S. Pat. No. 6,501,275B1

SUMMARY OF INVENTION

Problem to be Solved by Invention

A reason for vibrations generating between the gradient magnetic field generating device and the static magnetic field generating device is considered as follows:

In the gradient magnetic field generating source in the gradient magnetic field generating device, a pulse current is caused to flow to generate a liner gradient magnetic field. This allows the pulse current to flow through the gradient magnetic field generating source disposed in the static magnetic field generated by the static magnetic field generating source. This generates a Lorentz force due to coupling between the static magnetic field and the pulse current. The Lorentz force acts on the gradient magnetic field generating source and generates vibrations in the gradient magnetic field generating device inclusive of the gradient magnetic field generating source. Because the gradient magnetic field generating device is mounted on the static magnetic field generating device disposed in the vicinity thereof with a mounting part such as bolts, etc., the vibrations of the gradient magnetic field generating device are transmitted to the static magnetic field generating device through the mounting parts and the static magnetic field generating device also vibrates.

Further, a magnetic field (gradient magnetic field) leaked from the gradient magnetic field source to a gradient magnetic field generating device side of the static magnetic field generating source interlinks with electric-conducting parts forming the static magnetic field generating device, which generates eddy currents in the static magnetic field generating device. Coupling between the eddy currents and the static magnetic field generates the Lorentz force acting on the electric conducting parts in the static magnetic field generating device, so that the static magnetic field generating device vibrates.

In addition, when a static magnetic field intensity and a gradient magnetic field intensity (the pulse current flowing through the gradient magnetic field generating source) are increased to enhance a quality of the photographed tomographic image, the respective Lorentz forces described above are also increased, so that amplitudes of the vibrations of the gradient magnetic field generating device and the static magnetic field generating device are increased. The vibrations generated in these devices causes deterioration in the tomographic images and sound noises around the MRI device. More specifically, the tomographic image may be degraded by disturbance of the homogenous magnetic field caused by an unnecessary magnetic field (error magnetic field) generated in the imaging space caused by the eddy currents generated in the electrically-conductive parts in the static magnetic field generating device. Regarding the sound noise, the vibrations in the electrically-conductive parts in the static magnetic field generating device and the gradient magnetic field generating device transmits to the air, which generates a radiation sound noise. This provides the target body lying in the imagining space with unpleasant feeling or disturbance. As mentioned above, when the vibrations of the gradient magnetic field generating device and the magnetic field generating device in the MRI device can be decreased, this is useful to enhance a diagnosis accuracy by suppressing the deterioration in the tomographic images and to increase in pleasant feeling in the examination in which the sound noise is decreased.

However, in the technologies according to Patent document 1 and Patent document 2, since the electric conductor (plate) is arranged to cover the whole of the gradient magnetic field generating device, it is assumed that there may be a case where the tomographic image may be deteriorated by the error magnetic field generated by the eddy currents at locations on the electric conductor (plate) near the imaging space.

Therefore, a problem to be solved by the invention is in providing an MRI (magnetic resonance imaging) device capable of reducing the vibrations in which the deterioration of the tomographic images is avoided.

Means for Solving Problem

To solve the problem, the present invention provides an MRI (magnetic resonance imaging) device having conductive rings which are remote each other and make a pair and disposed in a pair of arranging regions on both sides in the homogeneous magnetic field direction of the region where the homogeneous magnetic field is generated.

Advantageous Effect

According to the present invention, there is provided an MRI (magnetic resonance imaging) device in which vibrations can be reduced in which the deterioration in the tomographic image is suppressed.

BRIEF DESCRIPTION OF THE DRAWINGS

FIG. 5 is a schematic drawing illustrating a part above the z axis of an elevation cross section view of an MRI device according to a third embodiment of the present invention.

FIG. 6 is a schematic drawing illustrating a part above the z axis (center axis) of an elevation cross section view of an MRI device according to a modification of the third embodiment of the present invention.

FIG. 9 is a schematic drawing illustrating a part above the z axis of an elevation cross section view of an MRI device according to a fifth embodiment of the present invention.

FIG. 10 is a schematic drawing illustrating a part above the z axis of an elevation cross section view of an MRI device according to a modification of the fifth embodiment of the present invention.

MODE FOR CARRYING OUT INVENTION

Next, embodiments of the present invention are described in detail with reference to drawings below. The same parts in respective drawings are designated with the same references and duplicated descriptions are omitted.

(First Embodiment)

Figure 1:
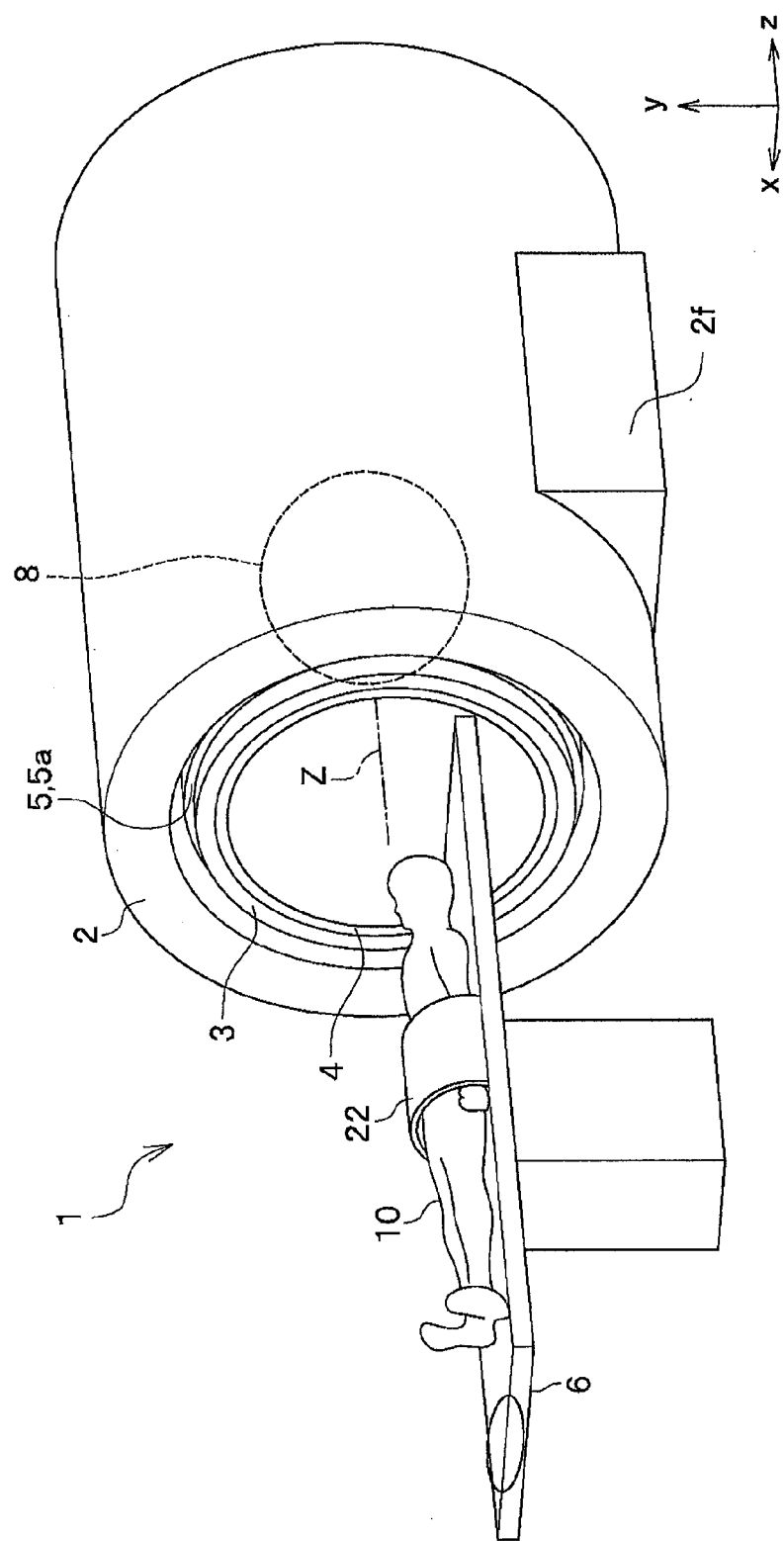
FIG. 1 is a perspective view of an MRI (magnetic resonance imaging) device according to a first embodiment of the present invention.

FIG. 1 shows a perspective view of an MRI (magnetic resonance imaging) device 1 according to a first embodiment of the present invention. The MRI device 1 includes: a static magnetic field generating device 2 having a cylindrical hollow tube allowing an object body 10 to be introduced into an imaging region 8 therein; a radiation coil 4 for radiating a high frequency signal to cause atomic nucleolus forming biomedical tissues of the introduced object body 10 to have magnetic nuclear resonance; a gradient magnetic field generating device 3 for applying positional information to each of signals emitted by the object body 10; a conductor ring 5 (5a) disposed outside in a diametrical direction of the gradient magnetic field generating device 3; a receiving coil 22 for receiving signals emitted by the object body 10; a bed 6 for carrying the object body 10; etc.

The static magnetic field generating device 2 generates a homogeneous magnetic field 7 (see FIG. 2) in the imaging space 8 to orient spins of atoms forming the biometric tissues of the object body 10. A shim coil (not shown) is provided on a static magnetic field generating device 2 side of the imaging space 8 to correct the magnetic field of the homogeneous magnetic field 7 to enhance the homogeneity. The static magnetic field generating device 2 is supported by a vacuum vessel supporting leg 2*f*. The static magnetic field generating device 2 has a cylindrical hollow tube shape on a center axis thereof on the z axis which is in parallel to a horizontal direction. The gradient magnetic field generating device 3 is disposed on an imaging space 8 side of the static magnetic field generating device 2. The gradient magnetic field generating device 3 has a cylindrical hollow tube shape on a center axis thereof which is common to the static magnetic field generating device 2 (the center axis being on a z axis). The radiation coil 4 is disposed on an imaging space 8 side of the gradient magnetic field generating device 3. The radiation coil 4 has a hollow cylindrical shape on a center axis thereof which is common to the static magnetic field generating device 2 (the center axis being on the z axis). The radiation coil 4 radiates a high frequency signal to cause nuclear magnetic resonance on atomic nuclei of atoms forming the biometric tissues of the object body 10. Further, there is attached the receiving coil 22 to the bed 6 for receiving the magnetic resonance signal generated by the nuclear magnetic resonance.

The conductor ring 5 (5*a*) is installed on an imaging space 8 side of the static magnetic field generating device 2. The conductor ring 5 (5*a*) is installed on an outside in a diametrical direction of the gradient magnetic field generating device 3. The conductor ring 5 (5*a*) has a hollow cylindrical shape having a center axis which is common to the those of the static magnetic field generating device 2 and the gradient magnetic field generating device 3 (center axes being on the z axis). The conductor ring 5 (5*a*) can be formed with copper or aluminum having non-magnetism and conductivity.

Figure 2:
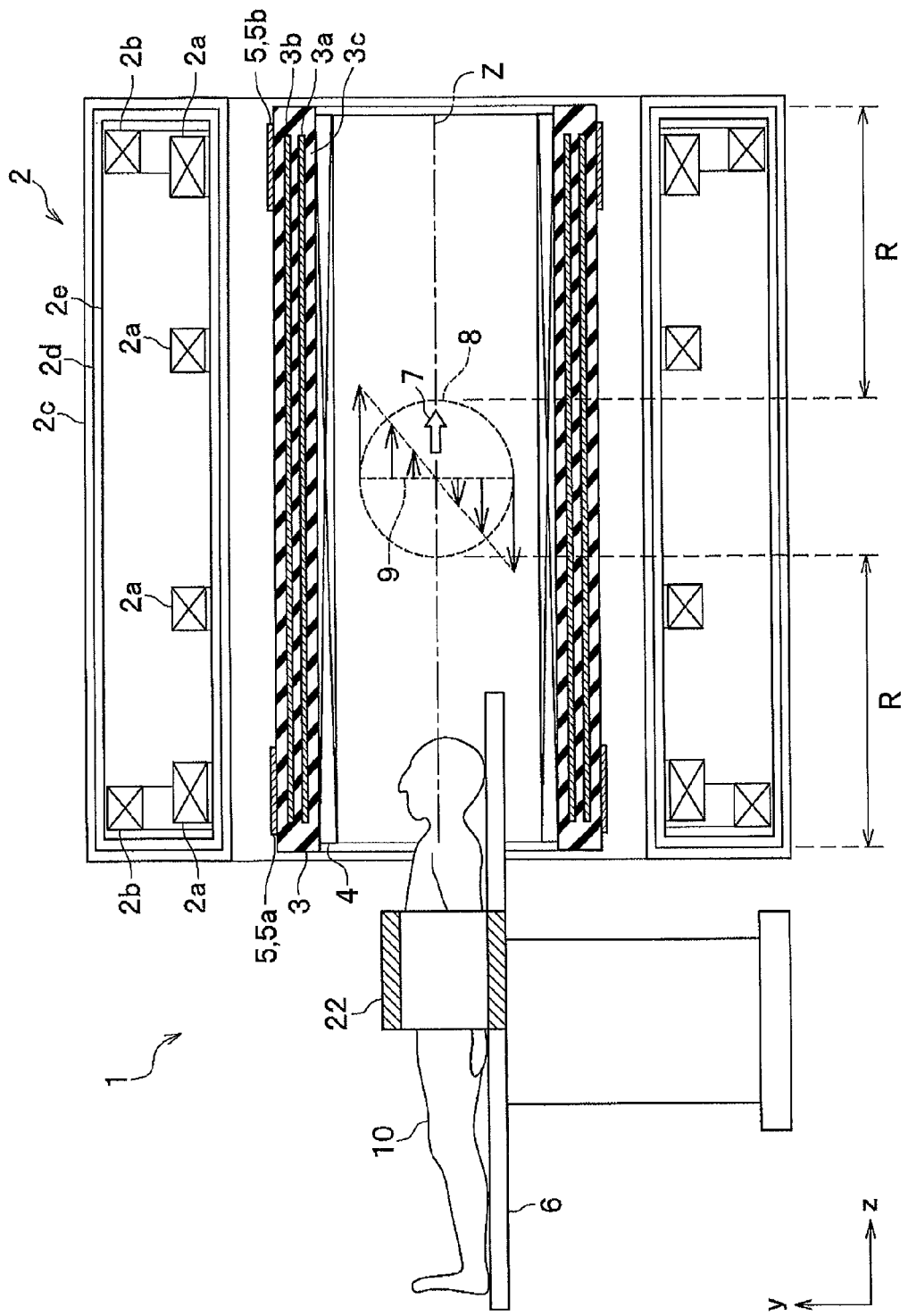
FIG. 2 is an elevation cross section view of the MRI device according to the first embodiment.

FIG. 2 shows an elevation cross section view of the MRI device 1 according to the first embodiment of the present invention. The static magnetic field generating device 2 includes a plurality of main coils (static magnetic field generating source) 2*a*, which are superconducting coils, a plurality of shield coils (static magnetic field generating source) 2*b*, which are superconducting coils, a cooling vessel 2*e* for containing the main coils 2*a* and the shield coils 2*b*, which are superconducting coils, together with a coolant, a radiation shield plate 2*d* for covering the cooling vessel 2*e* to shield radiation heat radiated by a vacuum vessel 2*c*, the vacuum vessel 2*c* for housing the cooling vessel 2*e* and the radiation shield plate 2*d* therein under a vacuum circumstance to shield the heat, the vacuum vessel supporting leg 2*f* (see FIG. 1) for supporting the vacuum vessel 2*c* on the installation floor, and a load supporting body (not shown) for supporting the cooling vessel 2*e* and the radiation shield plate 2*d* in the vacuum vessel 2*c* with heat insulation.

The main coils (static magnetic field generating source) 2*a* have ring shapes on center axes thereof which are common on the z axis. The plurality of main coils 2*a* (four main coils in the example in FIG. 2) are arranged in a z axis direction. The plurality of main coils 2*a* generate a static magnetic field, which becomes the homogeneous magnetic field 7 in the imaging space (space) 8. The plurality of main coils 2*a* generate the static magnetic field outside the imaging space 8, particularly, generates a residual magnetic field at a location more remote from the main coils 2*a*. The plurality of shield coils 2*b* (magnetic field generating sources) 2*b* can reduce a size of the residual magnetic field. The plurality of shield coils 2*b* have ring shapes with center axes thereof commonly disposed on the z axis. The plurality of shield coils 2*b* (two, i.e., a pair of, the shield coils 2*b*, in the example in FIG. 2) are arranged in the z-axis direction. The plurality of shield coil 2*b* are arranged near a pair of ones at both ends in the z-axis direction of an array out of the plurality of main coils 2*a* arranged in the array. The plurality of shield coils 2*b* are more remotely arranged from the z axis than the pair of main coils 2*a* arranged at both ends in the z-axis direction of the array.

In FIG. 2, though only one main coil 3*a* is shown for omission, actually the gradient magnetic field generating device 3 includes a plurality of main coils (gradient magnetic field generating source) 3*a*. Further, in FIG. 2 though one shield coil 3*b* is shown for omission, actually the gradient magnetic field generating device 3 includes a plurality of the shield coils (gradient magnetic field generating source) 3*b*. In addition, the gradient magnetic field generating device 3 includes a resin 3*c* for fixing the main coil 3*a* and the shield coil 3*b* each other.

The main coil (gradient magnetic field source) 3*a* has a hollow cylindrical shape having a center axis thereof on the z axis. The main coil 3*a* generates a gradient magnetic field 9 superimposed on the homogeneous magnetic field 7 in the imaging space 8. The main coil 3*a* generates residual magnetic field outside the imaging space 8. The shield coil (gradient magnetic field generating source) 3*b* can decrease the residual magnetic field in size. The shield coil 3*b* has a hollow cylindrical shape having a center axis on the z axis. The shield coil 3*b* is more remotely arranged from the z axis than the main coil 3*a*. The shield coil 3*b* is arranged on the static magnetic field generating device 2 on a side of the main coil 3*a*. The gradient magnetic field generating device 3 is fixed to the vacuum vessel 2*c* with mounting parts (not shown).

Figure 3:
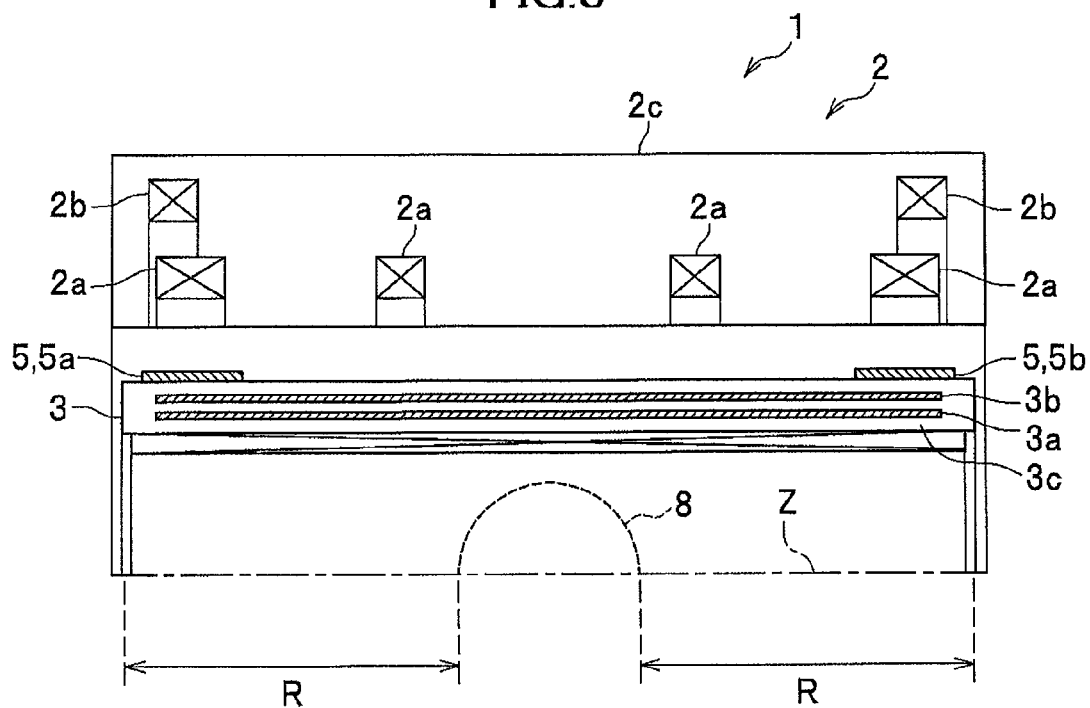
FIG. 3 is a schematic drawing illustrating a part above a z axis (center axis) on the elevation cross section view of an MRI device according to the first embodiment of the present invention.

As shown in FIG. 2 and FIG. 3, which is a partial drawing of FIG. 2, the conductor rings 5 (5*a*, 5*b*) are arranged between the static magnetic field generating source 2*a* of the static magnetic field generating device 2 and the gradient magnetic field generating source 3*a* of the gradient magnetic field generating device 3. The conductor rings 5 (5*a*, 5*b*) are arranged on a side of the gradient magnetic field generating source 3*a* opposite to the imaging space 8 where the gradient magnetic field 9 is generated. In addition, the conductor rings 5 (5*a*, 5*b*) are, in the z-axis direction (a magnetic field direction of the homogeneous magnetic field 7), arranged in the region where the gradient magnetic field generating device 3 is arranged on a side of the imaging space 8 of the region and on both sides in the static magnetic field direction (z-axis direction) of the region where the homogeneous magnetic field 7 is generated, preferably in a pair of arranging regions R on both outsides in the static magnetic field direction (z-axis direction of the region where the homogeneous magnetic field 7 is generated (the imaging space 8), respectively. A pair of rings 5*a* (5) and 5*b* (5) are spaced each other. The conductor rings (5*a*, 5*b*) 5 are mechanically connected to the gradient magnetic field generating device 3. The conductor rings 5 (5*a*, 5*b*) have electric resistivities per a unit plate thickness (sheet resistances) of the conductor rings 5 which are lower than electric resistivity per thickness of the outer walls of the vacuum vessel 2*c* (the radiation shield plate 2*d* and a cooling vessel 2*e*) and the gradient magnetic field generating device 3. Accordingly, it is desirable that the electric resistivities of the conductor rings 5 (5*a*, 5*b*) are lower than the resistivities of members such as the outside wall, etc., of the gradient magnetic field generating device 3. The conductor rings 5 (5*a*, 5*b*) are arranged near a pair of ones, at both ends of an array, out of the plurality of main coils 2*a* arranged in the z-axis direction in the array. The conductor rings 5 (5a, 5b) are arranged at locations in the z-axis direction where end parts of the main coil 3a and the shield coil 3b are arranged. The conductor rings 5 (5a, 5b) are arranged at locations in the z-axis direction where end parts on outsides in the z-axis direction of the main coil 2a and the shield coil 2b of the static magnetic field generating device are arranged. The end parts outside in the z-axis of the conductor rings 5 (5a, 5b) are allowed to reach the end parts outside in the z-axis direction of the gradient magnetic field generating device 3, but do not protrude therefrom.

The conductor ring 5a and the conductor ring 5b are spatially separately arranged in the z axis (the direction of the 7). In addition, each of the conductor ring 5a and the conductor ring 5b is preferably formed in a continuous body in a circumferential direction regarding the z axis. The conductor ring 5a and the conductor ring 5b may be exposed at a surface of the gradient magnetic field generating device 3 or embedded in the resin 3c between the surface of the gradient magnetic field generating device 3 and the shield coil 3b. A width in the z axis of the conductor ring 5a (5) is approximately equal to a width in the z axis of the conductor ring 5b (5) ((width of the conductor ring 5a)=(width of the conductor ring 5b)).

Next, suppression of vibrations in the MRI device 1 will be described.

In photographing, the homogeneous magnetic field 7 is generated in the imaging space 8 by the static magnetic field generating device 2 and at the same time a static magnetic field is also generated at a region where the gradient magnetic field generating device 3 is arranged. In the gradient magnetic field generating device 3, pulsate currents flow through the main coil 3a and the shield coil 3b arranged in the static magnetic field. Pulsate Lorentz forces act on the main coil 3a and the shield coil 3b due to coupling between the static magnetic field and the pulsate currents.

The vibrations of the gradient magnetic field generating device 3 transmit to the vacuum vessel 2c through the mounting parts for mounting the gradient magnetic field generating device 3 on the static magnetic field generating device 2 and to the radiation shield plate 2d and the cooling vessel 2e through the load supporting body from the vacuum vessel 2c, which vibrates respective parts of the static magnetic field generating device 2.

The magnetic field generated by the main coil 3a and the shield coil 3b of the gradient magnetic field generating device 3 and leaks to a side of the main coil 2a and the shield coil 2b of the static magnetic field generating device 2 induces eddy currents in the electrically conductive members such as the vacuum vessel (outer wall) 2c and the radiation shield plate 2d, and the cooling vessel 2e. The electrically conductive members (outer walls) of the static magnetic field generating device 2 vibrate by action of a Lorentz force.

The conductor rings 5 (5a, 5b) vibrate according to the vibration of the gradient magnetic field generating device 3. The vibration varies a relative distance between the conductor rings 5 (5a, 5b) and the main coil 2a and the shield coil 2b of the static magnetic field generating device 2. This causes variation in magnetic flux inter interlinked with the conductor rings 5 (5a, 5b), so that the eddy currents are induced in the conductor rings 5 (5a, 5b). At a frequency of the vibration which is relatively low, vibration attenuation effects largely due to the eddy current heat generation. When the frequency of the vibration is relatively high, the Lorentz force serves to cancel the vibrations of the conductor rings 5 (5a, 5b), the Lorentz force acting on the conductor rings 5 (5a, 5b) by coupling of the eddy currents induced by the conductor rings 5 (5a, 5b) with the magnetic field generated by the static magnetic field generating source (main coil 2a, shield coil 2b). More specifically, when the conductor rings 5 (5a, 5b) vibrates in the magnetic field, an electromagnetic reaction force act to keep a positional relation between the conductor rings 5 (5a, 5b) and the magnetic field generating source (the main coil 2a, the shield coil 2b). As a result, the vibrations of the conductor rings 5 (5a, 5b) are suppressed by the static magnetic field. Also vibrations of the gradient magnetic field generating device 3 are suppressed, the vibrations being mechanically (relative positions are unchanged) connected to the conductor rings 5 (5a, 5b). In addition to an electromagnetic vibration suppression effect described above, there is an effect to mechanically reduce the vibrations of the gradient magnetic field generating device 3 because a stiffness of the gradient magnetic field generating device 3 increased by mechanical connection of the conductor rings 5 (5a, 5b) with the gradient magnetic field generating device 3 (without relative position change). By decrease in the vibration of the gradient magnetic field generating device 3 by the electromagnetic and mechanical vibration suppression effects, which reduces the vibration transmission to the static magnetic field generating device 2 and the vibration of the static magnetic field generating device 2 are also suppressed.

The larger the magnetic flux linkage variation when the conductor ring 5 vibrates, the more strongly provided the electromagnetic vibration suppression effect. Generally, because the magnetic field intensity is inversely proportional to a distance from the magnetic field generating source, in order to broaden the imaging space 8 where the homogeneous magnetic field 7 is generated as long as the circumstance allows, the more remote position from the imaging space 8, the larger the magnetomotive force becomes, i.e., the main coil 2a as the static magnetic field generating source in the MRI device 1 has larger magnetomotive force at both ends in the z-axis direction (the direction of the homogeneous magnetic field 7). Accordingly, the conductor rings 5 (5a, 5b) are arranged near the main coils 2a at both ends in the z-axis direction (the direction of the homogeneous magnetic field 7), i.e., installed in the arranging regions R at both outsides in the z-axis direction of the imaging spaces, which can provides the vibration suppressing effect.

The installed conductor rings 5 (5a, 5b) shield the residual magnetic field leaked from the gradient magnetic field generating device 3 on a side of the static magnetic field generating device 2, which reduces eddy currents in the electrically conductive parts forming the static magnetic field generating device 2, so that Lorentz force decreases. This also reduces the vibrations in the static magnetic field generating device 2. Generally, the residual magnetic field from the gradient magnetic field generating device 3 has a tendency to become large around the both ends in the z-axis direction of the gradient magnetic field generating device 3. At that paces, a magnetomotive force of the main coils 2a becomes large. Installation of the conductor rings 5 (5a, 5b) can generates eddy currents having large current intensities in the conductor rings 5 (5a, 5b). Heat generation by the eddy currents attenuates the eddy currents. This provides shielding of the residual magnetic field. This suppresses generation of the eddy currents in the electrically conductive members (outer walls) of the static magnetic field generating device 2, suppressing the vibrations in the static magnetic field generating device 2. In addition, suppression of the eddy currents in the electrically conductive members (outer wall) of the static magnetic field generating device 2 reduces heat generation by eddy currents, which can reduce a quantity of the coolant put into the cooling vessel 2e to cool the main coil 2a and the shield coil 2b, which are super conducting coils, for example, a quantity of the liquid helium or cooling water.

On the other hand, because the eddy currents are induced in the conductor rings 5 (5a, 5b), deterioration in a quality in tomographic images may caused by an effect of error magnetic field by the eddy currents. However, the installation positions of the conductor rings 5 (5a, 5b) is set to be within the arranging regions R, which makes the distance between the imaging space 8 and the conductor rings 5 (5a, 5b) larger, so that the effect of the error magnetic field by the eddy current can be reduced. Also reduction of the eddy currents in the static magnetic field generating device 2 by the effect of shielding the residual magnetic field serves as an effect of reduction in the error magnetic field.

As described above, the conductor rings 5 (5a, 5b) provides the vibration suppressing effect in which the effect of the error magnetic field by the eddy currents generated in the conductor rings 5 (5a, 5b) is reduced. In addition, the conductor rings 5 (5a, 5b) are installed in the arranging regions R. This provides an efficient utilization of the space by using a space where the conductor rings 5 (5a, 5b) are not installed. For example, this allows installation of a mechanical vibration suppressing means such as a vibration attenuation member or an acoustical absorbent, installation of members such as the coils included in the gradient magnetic field generating device 3, and a magnetic energy reduction or shortening coil wires of the static magnetic field generating source (the main coil 2a, the shield coil 2b) by causing the static magnetic field generating source (the main coil 2a, the shield coil 2b) to approach to the side of the imaging space 8. In addition, it is enough that a quantity of the conductor used in the conductor rings 5 (5a, 5b) is small, this provides lightening, lowered cost, reduction in man-hour in manufacturing, or increase in productivity of the MRI device 1. When the conductor rings 5 (5a, 5b) are installed on a surface of the gradient magnetic field generating device 3, a heat radiation characteristic of the eddy current heat generation can be enhanced.

(Second Embodiment)

Figure 4:
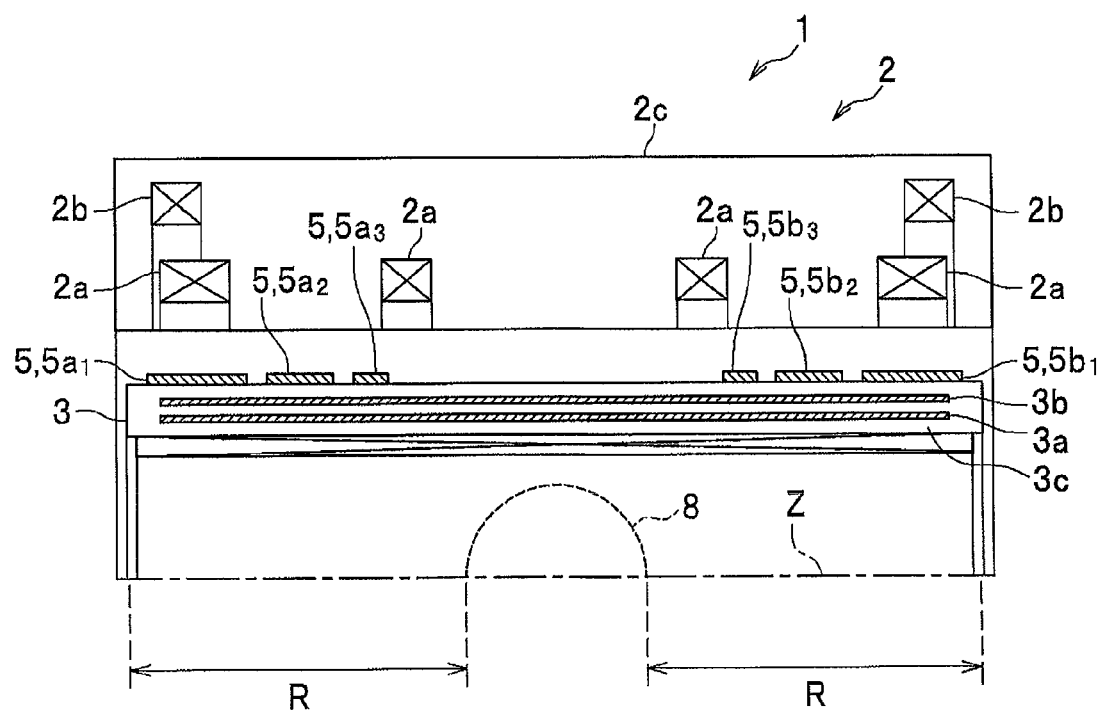
FIG. 4 is a schematic drawing illustrating a part above the z axis of an elevation cross section view of an MRI device according to a second embodiment of the present invention.

FIG. 4 shows a schematic drawing illustrating a part above the z axis (center axis) of an elevation cross section view of an MRI device according to a second embodiment of the present invention. The MRI device 1 according to the second embodiment is different from the MRI device 1 according to the first embodiment is in that a plurality of conductor rings 5 are installed in each of a pair of arranging regions R. More specifically, a plurality (three in the example in FIG. 4) of the conductor rings 5 ($5a_1$, $5a_2$, $5a_3$) are installed in one of the pair of arranging regions R. A plurality (three in the example in FIG. 4) of the conductor rings $5b_1$, $5b_2$, $5b_3$) are installed in the other of the pair of arranging regions R. The plurality of conductor rings $5a_1$, $5a_2$, $5a_3$ have ring shapes having center axes commonly disposed on the z axis. The plurality of conductor rings $5a_1$, $5a_2$, $5a_3$ are arranged in the z-axis direction. It is desirable that the more remote from the imaging space 8 in the z axis, the larger the widths of the conductor rings of conductor rings $5a_1$, $5a_2$, $5a_3$ becomes, i.e., (width of the conductor ring $5a_1$)>(width of the conductor ring $5a_2$)>(width of the conductor ring $5a_3$). Similarly, the plurality of conductor rings $5a_1$, $5a_2$, $5a_3$ have ring shapes having center axes commonly disposed on the z axis. The plurality of conductor rings $5b_1$, $5b_2$, $5b_3$ are arranged in the z-axis direction. It is desirable that the more remote from the imaging space 8 in the z axis, the larger the widths of the conductor rings of conductor rings $5b_1$, $5b_2$, $5b_3$ becomes, i.e., (width of the conductor ring $5b_1$)>(width of the conductor ring $5b_2$)>(width of the conductor ring $5b_3$). The plurality of conductor rings $5a_1$, $5a_2$, $5a_3$ and the plurality of conductor rings $5b_1$, $5b_2$, $5b_3$ are installed, which can generate the eddy currents at a wider area, so that the electromagnetic vibration suppression effect can be further enhanced. Further, like the first embodiment, the mechanical vibration suppression effect in the gradient magnetic field generating device 3 can be also provided. In addition, if it is interpreted that the conductor rings 5a, 5b in the first embodiment are divided into a plurality of the conductor rings $5a_1$, $5a_2$, $5a_3$ and the conductor rings $5a_1$, $5a_2$, $5a_3$. This can reduce sizes of the eddy of the generated eddy current, so that a heat radiation efficiency can be enhanced because the eddy current heat generation is distributed.

(Third Embodiment)

FIG. 5 shows a schematic drawing illustrating a part above the z axis (center axis) of an elevation cross section view of an MRI device according to a third embodiment of the present invention. The MRI device 1 according to the third embodiment is different from the MRI device 1 according to the first embodiment is in that the conductor rings 5 (5a, 5b) are mechanically (without relative position change) connected to the static magnetic field generating device 2 (the vacuum vessel 2c). The conductor rings 5 (5a, 5b) are installed on a side of the main coil 2a opposite to the imaging space 8 where the homogeneous magnetic field 7 (see FIG. 2). In photographing for a tomographic image, when the gradient magnetic field generating device 3 is supplied with a current, eddy currents are induced in the vacuum vessel 2c by the residual magnetic field generated by the gradient magnetic field generating device 3 and leaking to a side of the static magnetic field generating device 2, which cause vibrations in the vacuum vessel 2c by the Lorentz force. When the vacuum vessel 2c vibrates, both the conductor rings 5 (5a, 5b) also vibrate, which change a relative distance between the main coil 2a and the shield coil 2b of the static magnetic field generating source, so that the Lorentz force acts on the conductor rings 5 (5a, 5b). If the material forming the vacuum vessel 2c is an electrically conductive member, use of the conductor rings 5 (5a, 5b) having a resistance lower than that of the material of the vacuum vessel 2c increases magnetic coupling, so that a lager vibration suppression effect can be provided. Further, unlike the first embodiment, the installed conductor rings 5 (5a, 5b) provides the mechanical vibration suppression effect on the vacuum vessel. Further, like the first embodiment, the installed conductor rings 5 (5a, 5b) provides the vibration suppression effect by the shield of the residual magnetic field leaked from the gradient magnetic field generating device 3. In addition, when the vacuum vessel 2c has a higher thermal conductivity than the gradient magnetic field generating device 3, the heat radiation characteristic of the conductor rings 5 (5a, 5b), which is heated by the eddy current heat can be enhanced.

(Modification of the Third Embodiment)

FIG. 6 shows a schematic drawing illustrating a part above the z axis (center axis) of an elevation cross section view of an MRI device according to a modification of a third embodiment of the present invention. The MRI device 1 according to the modification of the third embodiment is different from the MRI device 1 according to the third embodiment is in that the conductor rings 5 (5a, 5b) are mechanically (without relative position change) connected to the vacuum vessel 2c on a vacuum side of the vacuum vessel 2c. According to this, radiated sounds associated with the vibrations of the conductor rings 5 (5a, 5b) are not transmitted through the air, so that the sound noise can be reduced. Further, because the conductor rings 5 (5a, 5b) can be housed in the vacuum vessel 2c, a space for the object body 10 surrounded by the static magnetic field generating device 2 is broadened, so that the MRI device 1 with a wider open space feeling can be provided.

(Fourth Embodiment)

Figure 7:
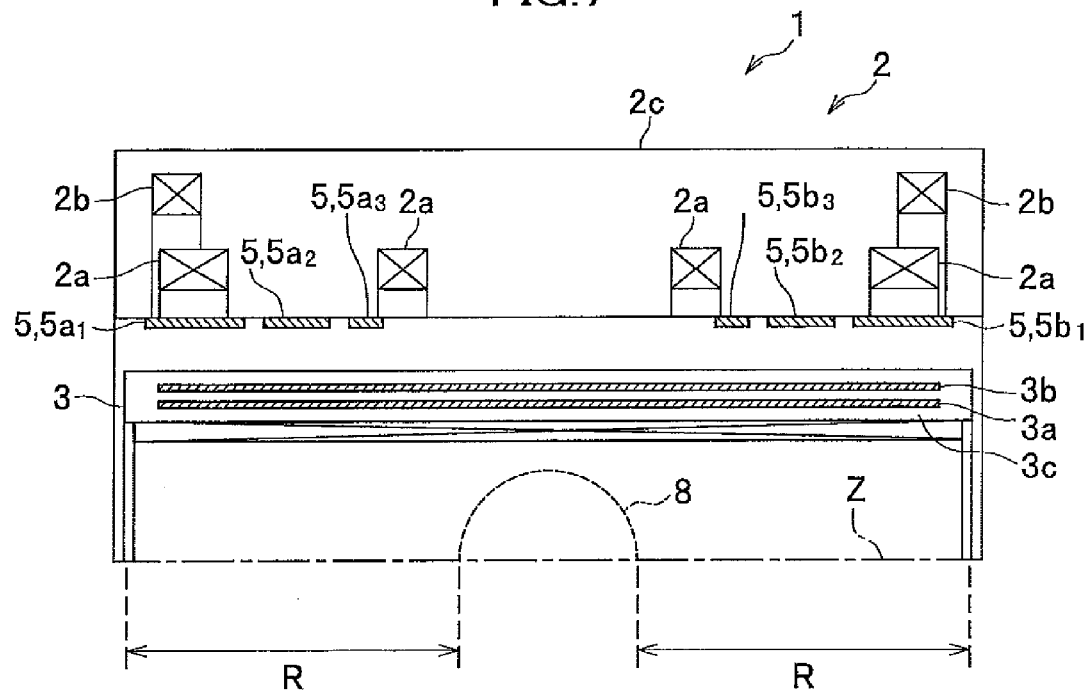
FIG. 7 is a schematic drawing illustrating a part above the z axis of an elevation cross section view of an MRI device according to a fourth embodiment of the present invention.

FIG. 7 shows a schematic drawing illustrating a part above the z axis (center axis) of an elevation cross section view of an MRI device 1 according to a fourth embodiment of the present invention. The MRI device 1 according to the fourth embodiment is different from the MRI device 1 according to the second embodiment (FIG. 4) is in that the conductor rings 5 ($5a_1$, $5a_2$, $5a_3$, $5b_1$, $5b_2$, $5b_3$) are mechanically (without relative position change) connected to the static magnetic field generating device 2 (the vacuum vessel 2c). According to this, the effect according to the first, second, and third embodiments can be obtained.

(Modification of the Fourth Embodiment)

Figure 8:
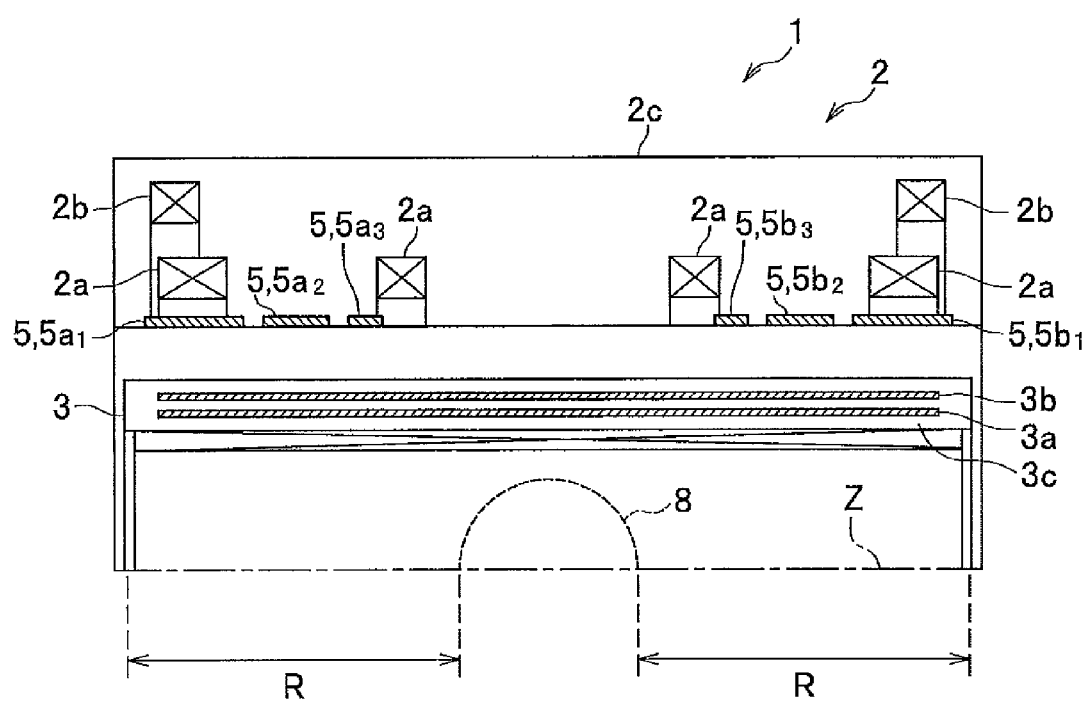
FIG. 8 is a schematic drawing illustrating a part above the z axis of an elevation cross section view of an MRI device according to a modification of the fourth embodiment of the present invention.

FIG. 8 shows a schematic drawing illustrating a part above the z axis (center axis) of an elevation cross section view of an MRI device 1 according to a modification of the fourth embodiment of the present invention. The MRI device 1 according to the modification of the fourth embodiment is different from the MRI device 1 according to the fourth embodiment is in that the conductor rings 5 ($5a_1$, $5a_2$, $5a_3$, $5b_1$, $5b_2$, $5b_3$) are mechanically (without relative position change) connected to the vacuum vessel 2c on a vacuum side of the vacuum vessel 2c. This provides the effect on the modifications of the first, second, and third embodiments.

(Fifth Embodiment)

FIG. 9 shows a schematic drawing illustrating a part above the z axis of an elevation cross section view of an MRI device according to a fifth embodiment of the present invention. The MRI device 1 according to the fifth embodiment is different from the MRI device 1 according to the first embodiment is in that the conductor rings 5 (5a, 5b (refer the first embodiment and see FIG. 3)) comprise first conductor rings 5 (5ai, 5bi) mechanically (without relative position change) connected to the gradient magnetic field generating device 3 and second conductor rings 5 (5ao, 5bo) mechanically (without relative position change) connected to the static magnetic field generating device 2 (the vacuum vessel 2c) and facing the first conductor rings 5 (5ai, 5bi) with insulation from the first conductor rings 5 (5ai, 5bi). The first conductor ring 5ai (5) and the second conductor ring 5ao (5) face close to each other and do not mechanically support each other and are electrically insulated. Similarly, a first conductor ring 5bi (5) and a second conductor ring 5bo face close to each other, do not mechanically support each other, and are electrically insulated from each other. A width in the z-axis direction of the first conductor rings 5 (5ai, 5bi) is approximately equal to widths of the second conductor ring 5 (5ao, 5bo). More specifically, there are relations, i.e., (width of first conductor ring 5bo)=(width of the second conductor ring 5ao) and (width of the first conductor ring 5bi)=(Width of the second conductor ring 5bo).

This provides magnetic coupling between the first conductor rings 5 (5ai, 5bi) and the second conductor rings 5 (5ao, 5bo) by mutual induction each other. More specifically, where either one of the first conductor rings 5 (5ai, 5bi) or the second conductor rings 5 (5ao, 5bo) vibrates, an eddy current is generated in the conductor ring. However, the magnetic coupling induces an eddy current flowing in an opposite direction in the other one. As a result, a Lorentz force is generated between the first conductor rings 5 (5ai, 5bi) and the second conductor rings 5 (5ao, 5bo) facing each other in a repelling direction thereof with a relation of acting and reacting, the vibration suppression effect being enhanced. The vibration suppression effect in the case where the second conductor rings 5 (5ao, 5bo) on the side of the static magnetic field generating device 2 is installed on the imaging space 8 side of the vacuum vessel 2c becomes stronger because a distance between the first conductor ring 5 (5ai, 5bi) and the second conductor ring 5 (5ao, 5bo) becomes shorter.

(Modification of the Fifth Embodiment)

FIG. 10 is a schematic drawing illustrating a part above the z axis of an elevation cross section view of an MRI device according to a modification of the fifth embodiment of the present invention. The MRI device 1 according to the modification of the fifth embodiment is different from the MRI device 1 according to the fifth embodiment is in that the second conductor rings 5 (5ao, 5bo) are mechanically (without relative position change) connected to the vacuum vessel 2c on a vacuum side of the vacuum vessel 2c. This also provides the same effect as provided in the first embodiment, the modification of the third embodiment, and the fifth embodiment.

(Sixth Embodiment)

Figure 11:
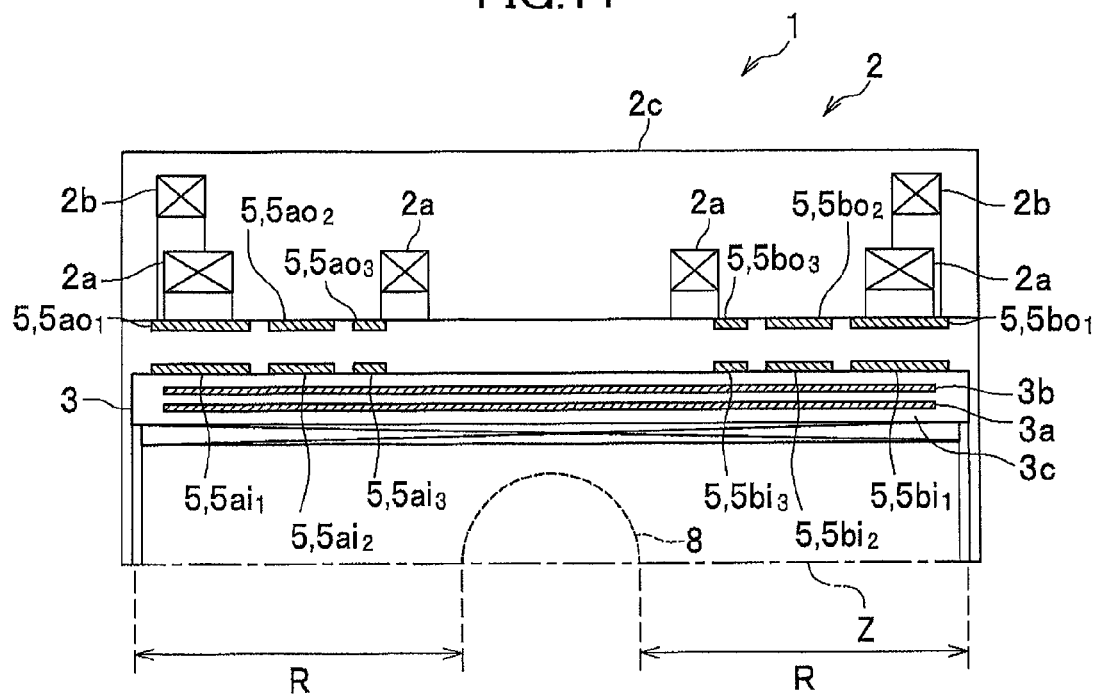
FIG. 11 is a schematic drawing illustrating a part above the z axis of an elevation cross section view of an MRI device according to a sixth embodiment of the present invention.

FIG. 11 is a schematic drawing illustrating a part above the z axis of an elevation cross section view of an MRI device according to a sixth embodiment of the present invention. The MRI device 1 according to the sixth embodiment is different from the MRI device 1 according to the fifth embodiment is in that a plurality of first conductor rings 5 (5ai, 5bi (the fifth embodiment, see FIG. 9)) are installed on each of a pair of the arranging regions R. Further, a plurality of second conductor rings 5 (5ao, 5bo (the fifth embodiment, see FIG. 9)) are installed on each of a pair of the arranging regions R.

More specifically, a plurality of first conductor rings $5ai_1$, $5ai_2$, $5ai_3$ (three in the example in FIG. 11) are installed in one of the pair of the arranging regions R. A plurality of first conductor rings $5bi_1$, $5bi_2$, $5bi_3$ (three in the example in FIG. 11) are installed in the other of the pair of the arranging regions R. The first conductor rings $5ai_1$, $5ai_2$, $5ai_3$ have ring shapes having center axes commonly disposed on the z axis. The plurality of the first conductor rings $5ai_1$, $5ai_2$, $5ai_3$ are arranged in the z-axis direction. It is desirable that the more remote from the imaging space 8 the first conductor rings $5ai_1$, $5ai_2$, $5ai_3$ are, the larger the widths of the first conductor rings $5ai_1$, $5ai_2$, $5ai_3$ are, i.e., (width of the first conductor ring $5ai_1$)>(width of the first conductor ring $5ai_2$)>(width of the first conductor ring $5ai_3$). Similarly, the first conductor rings $5bi_1$, $5bi_2$, $5bi_3$ have ring shapes having center axes commonly disposed on the z-axis. The plurality of the first conductor rings $5bi_1$, $5bi_2$, $5bi_3$ are arranged in the z-direction. It is desirable that the more remote from the imaging space 8 the first conductor rings $5bi_1$, $5bi_2$, $5bi_3$ are, the larger the widths of the first conductor rings $5bi_1$, $5bi_2$, $5bi_3$ are, i.e., (width of the first conductor ring $5bi_1$)>(width of the first conductor ring $5bi_2$)>(width of the first conductor ring $5bi_3$). Because the first conductor ring $5ai_1$, $5ai_2$, $5ai_3$ and the first conductor rings $5bi_1$, $5bi_2$, $5bi_3$ can generate the eddy currents in a broader area, so that the vibration suppression effect can be further enhanced. This also provides the same effect as provided in the first, second, fourth, and the fifth embodiments.

A plurality of second conductor rings 5ao, $5ao_2$, $5ao_3$ (three in the example in FIG. 11) are installed in one of the pair of the arranging regions R. A plurality of second conductor rings $5bo_1$, $5bo_2$, $5bo_3$ (three in the example in FIG. 11) are installed in the other of the pair of the arranging regions R. The second conductor rings $5ao_1$, $5ao_2$, $5ao_3$ have ring shapes having center axes commonly disposed on the z axis. The plurality of the second conductor rings $5ao_1$, $5ao_2$, $5ao_3$ are arranged in the z-axis direction. It is desirable that the more remote from the imaging space 8 the second conductor rings $5ao_1$, $5ao_2$, $5ao_3$ are, the larger the widths of the second conductor rings $5ao_1$, $5ao_2$, $5ao_3$ are, i.e., (width of the second conductor ring $5ao_1$)>(width of the second conductor ring $5ao_2$)>(width of the second conductor ring $5ao_3$). Similarly, the second conductor rings $5bo_1$, $5bo_2$, $5bo_3$ have ring shapes having center axes commonly disposed on the z-axis. The plurality of the second conductor rings $5bo_1$, $5bo_2$, $5bo_3$ are arranged in the z-axis direction. It is desirable that the more remote from the imaging space 8 the second conductor rings $5bo_1$, $5bo_2$, $5bo_3$ are, the larger the widths of the second conductor rings $5bo_1$, $5bo_2$, $5bo_3$ are, i.e., (width of the second conductor ring $5bo_1$)>(width of the second conductor ring $5bo_2$)>(width of the second conductor ring $5bo_3$). Because the second conductor ring $5ao_1$, $5ao_2$, $5ao_3$ and the second conductor ring $5bo_1$, $5bo_2$, $5bo_3$ can generate the eddy currents in a broader area, so that the vibration suppression effect can be further enhanced.

Further, a first conductor ring $5ai_1$ and a second conductor ring $5ao_1$ face close to each other. A width in the z-axis direction of the first conductor ring $5ai_1$ is approximately equal to a width in the z-axis direction of the second conductor ring $5ao_1$, i.e., (width of the first conductor ring $5ai_1$)=(width of the second conductor ring $5ao_1$)). The first conductor ring $5ai_2$ and a second conductor ring $5ao_2$ closely face each other. A width in the z-axis direction of the first conductor ring $5ai_2$ is approximately equal to a width of the second conductor ring $5ao_2$, i.e., ((width of the first conductor ring $5ai_2$)=(width of the second conductor ring $5ao_2$)). The first conductor ring $5ai_3$ and a second conductor ring $5ao_3$ face close to each other. A width in the z-axis direction of the first conductor ring $5ai_3$ is approximately equal to a width of the second conductor ring $5ao_3$, i.e., ((width of the first conductor ring $5ai_3$)=(width of the second conductor ring $5ao_3$)). The first conductor ring $5bi_3$ and a second conductor ring $5ao_3$ face close to each other. A width in the z-axis direction of the first conductor ring $5bi_1$ is approximately equal to a width of the second conductor ring $5bo_1$, i.e., ((width of the first conductor ring $5bi_1$)=(width of the second conductor ring $5bo_1$)). The first conductor ring $5bi_2$ and a second conductor ring $5bo_2$ face close to each other. A width in the z-axis direction of the first conductor ring $5bi_2$ is approximately equal to a width of the second conductor ring $5bo_2$, i.e., ((width of the first conductor ring $5bi_2$)=(width of the second conductor ring $5bo_2$)). The first conductor ring $5bi_3$ and a second conductor ring $5bo_3$ face close to each other. A width in the z-axis direction of the first conductor ring $5bi_3$ is approximately equal to a width in the z-axis direction of the second conductor ring $5bo_3$, i.e., ((width of the first conductor ring $5bi_3$)=(width of the second conductor ring $5bo_3$)).

(Modification of the Sixth Embodiment)

Figure 12:
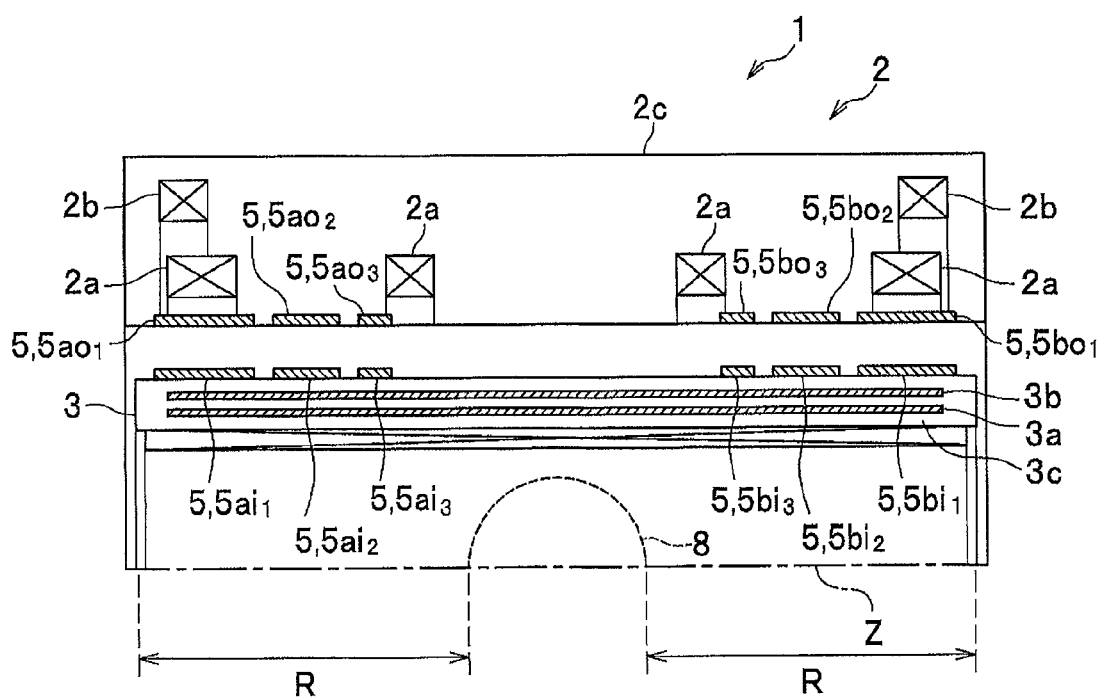
FIG. 12 is a schematic drawing illustrating a part above the z axis of an elevation cross section view of an MRI device according to a modification of the sixth embodiment of the present invention.

FIG. 12 shows a schematic drawing illustrating a part above the z axis of an elevation cross section view of an MRI device according to a modification of the sixth embodiment of the present invention. The MRI device 1 according to the modification of the sixth embodiment is different from the MRI device 1 according to the sixth embodiment is in that the second conductor ring 5 ($5ao_1$, $5ao_2$, $5ao_3$, $5bo_1$, $5bo_2$, $5bo_3$) are mechanically (without relative position change) connected to the vacuum vessel 2c on a vacuum side of the vacuum vessel 2c. This also provides the same effect as provided in the first, second, fourth, fifth, and sixth embodiments.

(Seventh Embodiment)

Figure 13:
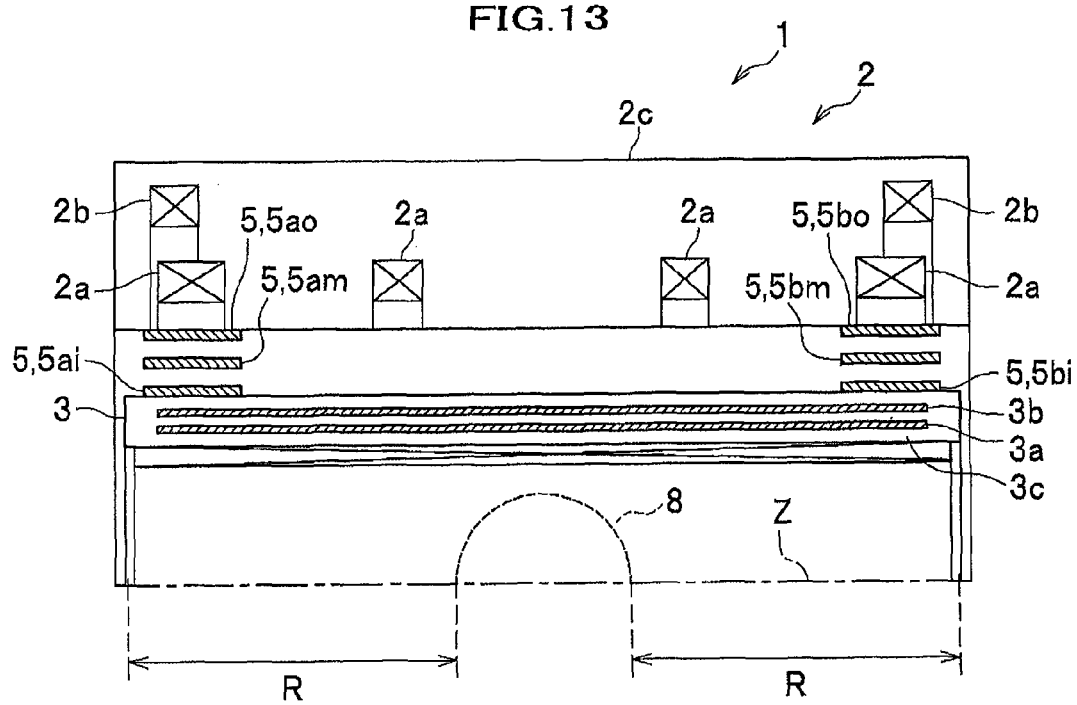
FIG. 13 is a schematic drawing illustrating a part above the z axis of an elevation cross section view of an MRI device according to a seventh embodiment of the present invention.

FIG. 13 shows a schematic drawing illustrating a part above the z axis of an elevation cross section view of an MRI device 1 according to a seventh embodiment of the present invention. The MRI device 1 according to the seventh embodiment is different from the MRI device 1 according to the fifth embodiment is in that the first conductor rings 5 (5a, 5b) are further installed between the first conductor rings 5 (5ai, 5bi) and the second conductor rings 5 (5ao, 5bo), which are third conductor rings 5 (5am, 5bm) which are insulated from the first conductor ring 5 (5ai, 5bi) and the second conductor rings (5ao, 5bo). According to this, increase in the number of the conductor rings can make the gap between the conductor rings smaller, so that the vibration suppression effect described in the fifth embodiment can be obtained more surely. The third conductor rings 5 (5am, 5bm) are supported by, for example, a ceiling, a wall, a floor of the room where the MRI device 1 is installed.

The third conductor ring 5am (5) and the first conductor ring 5ai (5) closely face each other and not mechanically supported each other and are electrically insulated. Similarly the third conductor rings 5am (5) and the second conductor ring 5ao (5) closely face each other and not mechanically supported each other and are electrically insulated from each other. The third conductor ring 5bm (5) and the first conductor ring 5bi (5) closely face each other and not mechanically supported each other and are electrically insulated from each other. Similarly the third conductor ring 5bm (5) and the second conductor ring 5bo (5) closely face each other and not mechanically supported each other and are electrically insulated from each other. Widths in the z-axis direction of the third conductor rings 5 (5am, 5bm) are approximately equal to a width in the z-axis direction of the first conductor rings 5 (5ai, 5bi) and widths of the second conductor rings 5 (5ao, 5bo), i.e., ((width of the third conductor ring 5am)=((width of the first conductor ring 5ai)=(width of the second conductor ring 5ao), and (width of the third conductor ring 5bm)=(width of the first conductor ring 5bi)=(width of the second conductor ring 5bo)).

(Modification of the Seventh Embodiment)

Figure 14:
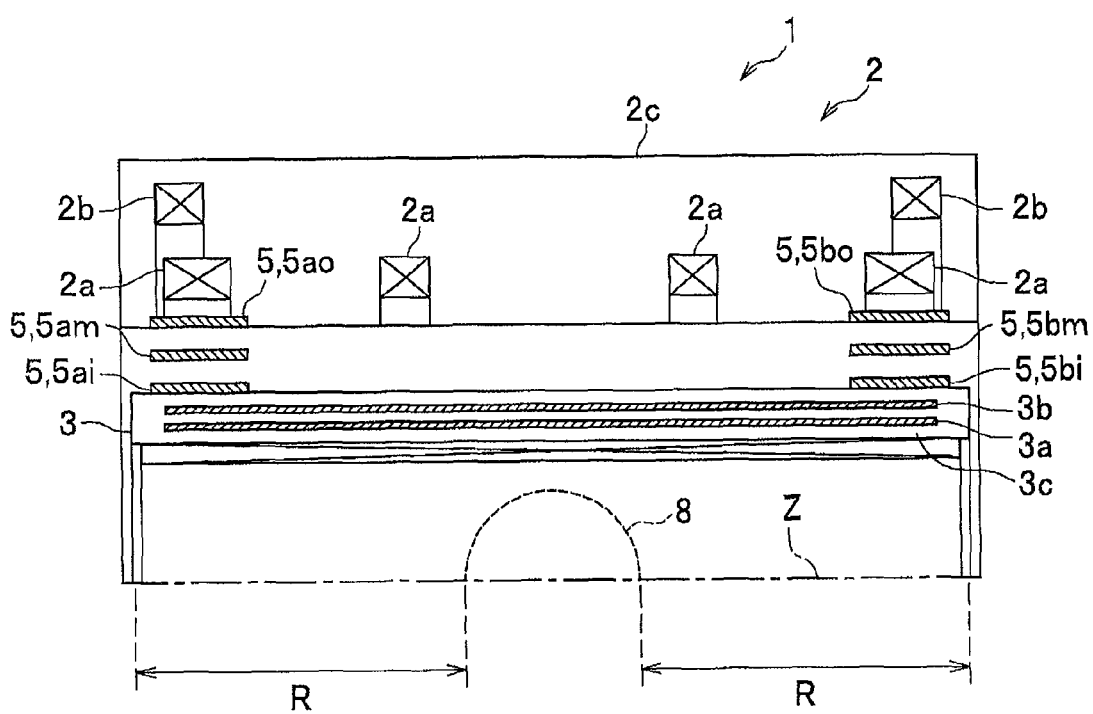
FIG. 14 is a schematic drawing illustrating a part above the z axis of an elevation cross section view of an MRI device according to a modification of the seventh embodiment of the present invention.

FIG. 14 is a schematic drawing illustrating a part above the z axis of an elevation cross section view of an MRI device 1 according to a modification of the sixth embodiment of the present invention. The MRI device 1 according to the modification of the seventh embodiment is different from the MRI device 1 according to the seventh embodiment is in that the second conductor rings 5 (5ao, 5bo) are mechanically (without relative position change) connected to the vacuum vessel 2c on a vacuum side of the vacuum vessel 2c. This also provides the same effect as provided in the fifth embodiment.

(Eighth Embodiment)

Figure 15:
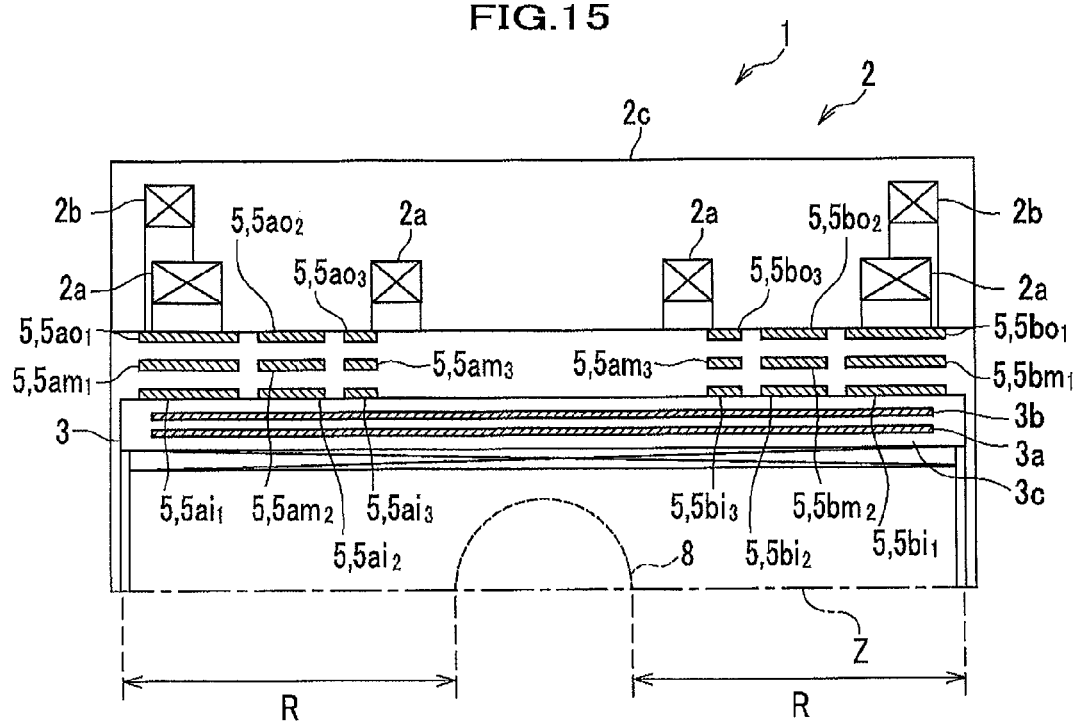
FIG. 15 is a schematic drawing illustrating a part above a z axis of an elevation cross section view of an MRI device according to an eighth embodiment of the present invention.

FIG. 15 shows a schematic drawing illustrating a part above a z axis of an elevation cross section view of an MRI device according to an eighth embodiment of the present invention. The MRI device 1 according to the eighth embodiment is different from the MRI device 1 according to the sixth embodiment is in that the conductor rings 5 (5a, 5b) are further installed between the first conductor rings 5 ($5ai_1$, $5ai_2$, $5ai_3$, $5bi_1$, $5bi_2$, $5bi_3$) and the second conductor rings 5 ($5ao_1$, $5ao_2$, $5ao_3$, $5bo_1$, $5bo_2$, $5bo_3$), which are third conductor rings 5 ($5am_1$, $5am_2$, $5am_3$, $5bm_1$, $5bm_2$, $5bm_3$) which are insulated from the first conductor rings 5 ($5ai_1$, $5ai_2$, $5ai_3$, $5bi_1$, $5bi_2$, $5bi_3$) and the second conductor rings 5 ($5ao_1$, $5ao_2$, $5ao_3$, $5bo_1$, $5bo_2$, $5bo_3$).

According to this, increase in the number of the conductor rings can make the gap between the conductor rings smaller, so that the vibration suppression effect described in the fifth embodiment can be further enhanced.

The third conductor rings $5am_1$, $5am_1$, $5am_3$ (5) and the first conductor rings $5ai_1$, $5ai_2$, $5ai_3$ (5) closely face each other and not mechanically supported each other and are electrically insulated from each other. Similarly, the third conductor rings $5am_1$, $5am_2$, $5am_3$ (5) and the second conductor rings $5ao_1$, $5ao_2$, $5ao_3$ (5) closely face each other and not mechanically supported each other and are electrically insulated from each other. The third conductor rings $5bm_1$, $5bm_2$, $5am_3$ (5) and the first conductor rings $5bi_1$, $5bi_2$, $5bi_3$ (5) closely face each other and not mechanically supported each other and are electrically insulated from each other. Similarly, the third conductor rings $5bm_1$, $5bm_2$, $5bm_3$ (5) and the second conductor rings $5bo_1$, $5bo_2$, $5bo_3$ (5) closely face each other and not mechanically supported each other and are electrically insulated from each other.

Widths in the z-axis direction of the third conductor rings 5 ($5am_1$, $5bm_1$) are approximately equal to widths in the z-axis direction of the first conductor rings 5 ($5ai_1$, $5bi_1$) and widths of the second conductor rings 5 ($5ao_1$, $5bo_1$), i.e., ((width of the third conductor ring $5am_1$)=(width of the first conductor ring $5ai_1$)=(width of the second conductor ring $5ao_1$), and (width of the third conductor ring $5bm_1$)=(width of the first conductor ring $5bi_1$)=(width of the second conductor ring $5bo_1$)). Widths in the z-axis direction of the third conductor rings 5 ($5am_2$, $5bm_2$) are approximately equal to widths in the z-axis direction of the first conductor rings 5 ($5ai_2$, $5bi_2$) and widths of the second conductor rings 5 ($5ao_2$, $5bo_2$), respectively, i.e., ((width of the third conductor ring $5am_2$)=(width of the first conductor ring $5ai_2$)=(width of the second conductor ring $5ao_2$), and (width of the third conductor ring $5bm_2$)=(width of the first conductor ring $5bi_2$)=(width of the second conductor ring $5bo_2$)).

Widths in the z-axis direction of the third conductor rings 5 ($5am_3$, $5bm_3$) are approximately equal to widths in the z-axis direction of the first conductor rings 5 ($5ai_3$, $5bi_3$) and widths in the z-axis direction of the second conductor rings 5 ($5ao_3$, $5bo_3$), respectively, i.e., ((width of the third conductor ring $5am_3$)=(width of the first conductor ring $5ai_3$)=(width of the second conductor ring $5ao_3$), and (width of the third conductor ring $5bm_3$)=(width of the first conductor ring $5bi_3$)=(width of the second conductor ring $5bo_3$)).

(Modification of the Eighth Embodiment)

Figure 16:
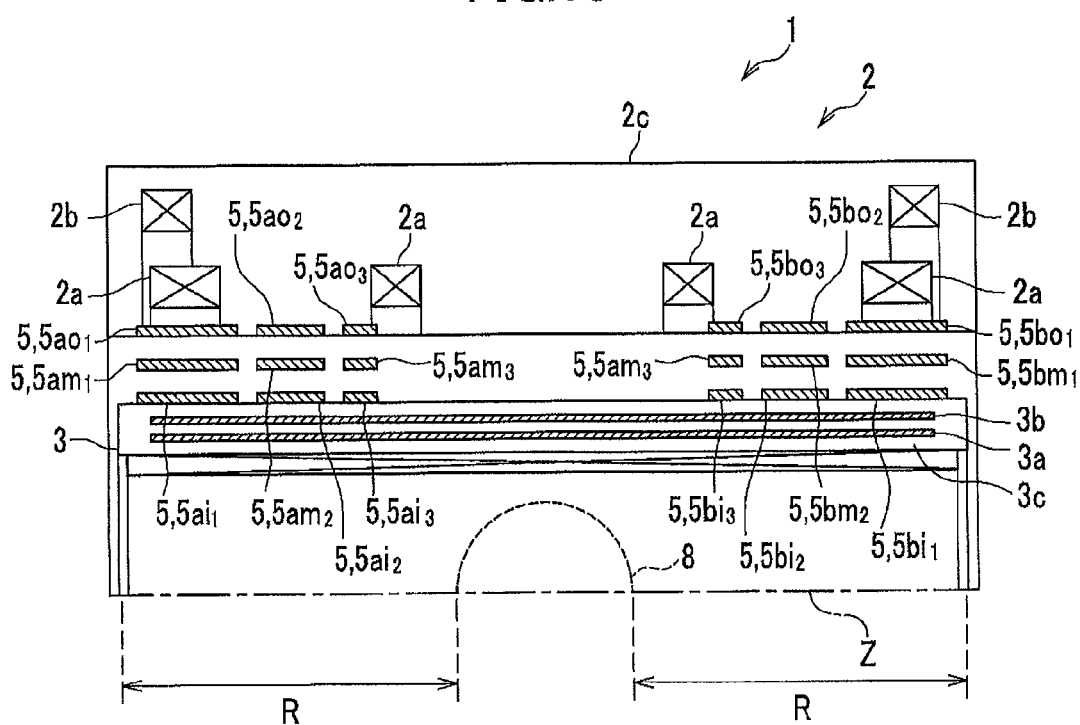
FIG. 16 is a schematic drawing illustrating a part above a z axis (center axis) of an elevation cross section view of an MRI device according to a modification of the eighth embodiment of the present invention.

FIG. 16 shows a schematic drawing illustrating a part above a z axis of an elevation cross section view of an MRI device 1 according to a modification of the eighth embodiment of the present invention. The MRI device 1 according to the modification of the eighth embodiment is different from the MRI device 1 according to the eighth embodiment is in that the second conductor rings 5 ($5ao_1$, $5ao_2$, $5ao_3$, $5bo_1$, $5bo_2$, $5bo_3$) are mechanically (without relative position change) connected to the vacuum vessel $2c$ on a vacuum side of the vacuum vessel $2c$. Also this provides the same effect as provided in the in the eighth embodiment.

(Ninth Embodiment)

Figure 17:
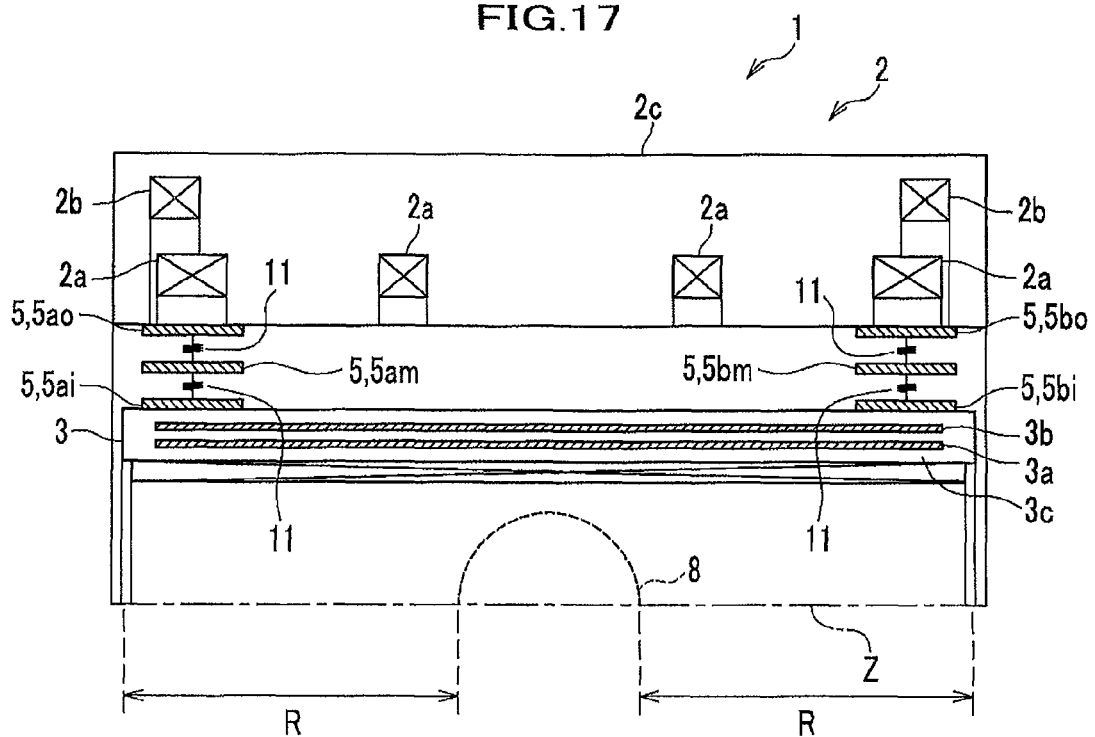
FIG. 17 is a schematic drawing illustrating a part above a z axis of an elevation cross section view of an MRI device according to a ninth embodiment of the present invention.

FIG. 17 shows a schematic drawing illustrating a part above a z axis of an elevation cross section view of an MRI device 1 according to a ninth embodiment of the present invention. The MRI device 1 according to the ninth embodiment is different from the MRI device 1 according to the seventh embodiment in that an elastic member 11 is provided between the first conductor rings 5 ($5ai$, $5bi$) and the second conductor rings 5 ($5ao$, $5bo$). The elastic members 11 are installed between the first conductor rings 5 ($5ai$, $5bi$) and the third conductor rings 5 ($5am$, $5bm$), respectively. Also, the elastic members 11 are installed between the second conductor rings 5 ($5ao$, $5bo$) and the third conductor rings 5 ($5am$, $5bm$), respectively. According to this, the third conductor rings 5 ($5am$, $5bm$) are elastically supported by the first conductor rings 5 ($5ai$, $5bi$) and the second conductor rings 5 ($5ao$, $5bo$) without external support. This provides the same effect as provided in the seventh embodiment. In addition, the elastic member 11 is not limited to the spring member shown in FIG. 17, but may be a rubber member. It is also possible to fill a rubber material in gaps made by the first conductor ring 5 ($5ai$, $5bi$) and the second conductor rings 5 ($5ao$, $5bo$), and the second conductor rings 5 ($5ao$, $5bo$) and the third conductor rings 5 ($5am$, $5bm$) for adhesion each other for integration. In addition, the integration may be made with spring members.

(Tenth Embodiment)

Figure 18:
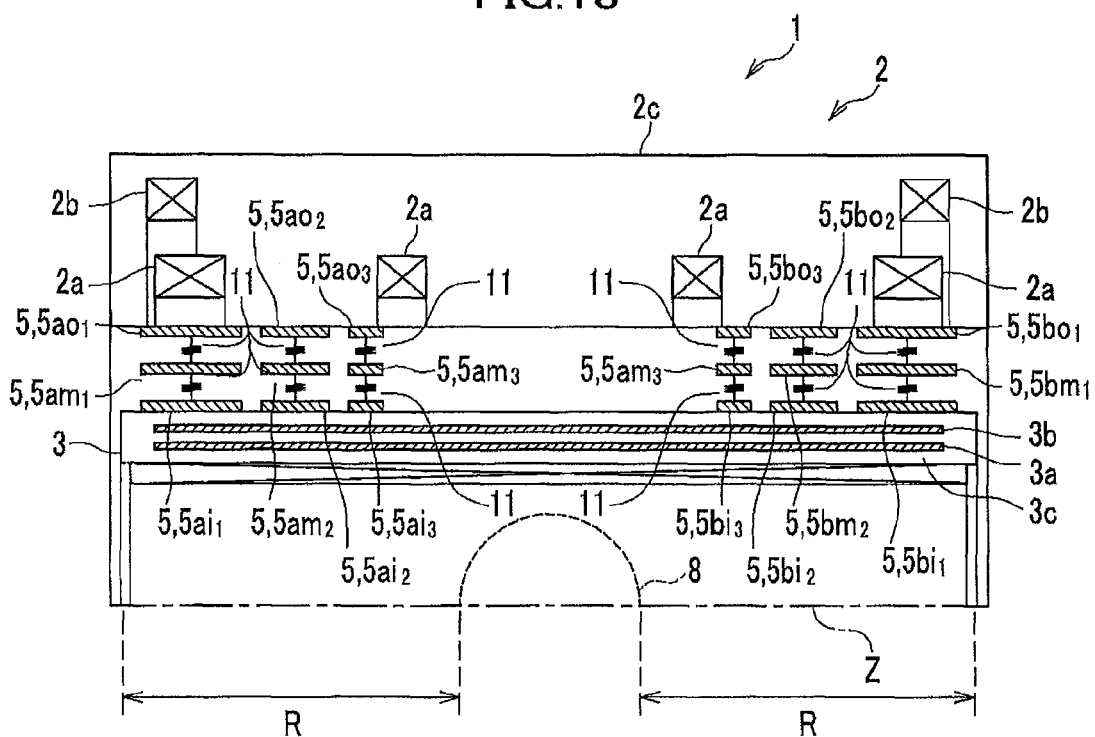
FIG. 18 is a schematic drawing illustrating a part above a z axis of an elevation cross section view of an MRI device according to a tenth embodiment of the present invention.

FIG. 18 shows a schematic drawing illustrating a part above a z axis of an elevation cross section view of an MRI device according to a tenth embodiment of the present invention. The MRI device 1 according to the tenth embodiment is different from the MRI device 1 according to the eighth embodiment in that elastic members 11 are provided between the first conductor rings 5 ($5ai_1$, $5ai_2$, $5ai_3$, $5bi_1$, $5bi_2$, $5bi_3$) and the second conductor rings 5 ($5ao_1$, $5ao_2$, $5ao_3$, $5bo_1$, $5bo_2$, $5bo_3$). The elastic members 11 are installed between the first conductor rings 5 ($5ai_1$, $5ai_2$, $5ai_3$, $5bi_1$, $5bi_2$, $5bi_3$) and the third conductor rings 5 ($5am_1$, $5am_2$, $5am_3$, $5bm_1$, $5bm_2$, $5bm_3$). The elastic members 11 are installed between the second conductor rings 5 ($5ao_1$, $5ao_2$, $5ao_3$, $5bo_1$, $5bo_2$, $5bo_3$) and the third conductor rings 5 ($5am_1$, $5am_2$, $5am_3$, $5bm_1$, $5bm_2$, $5bm_3$). According to this, the third conductor rings 5($5am_1$, $5am_2$, $5am_3$, $5bm_1$, $5bm_2$, $5bm_3$) are elastically supported by the first conductor rings 5 ($5ai_1$, $5ai_2$, $5ai_3$, $5bi_1$, $5bi_2$, $5bi_3$) and the second conductor rings 5 ($5ao_1$, $5ao_2$, $5ao_3$, $5bo_1$, $5bo_2$, $5bo_3$) without external support. This provides the same effect as provided in the eighth embodiment.

(Eleventh Embodiment)

Figure 19:
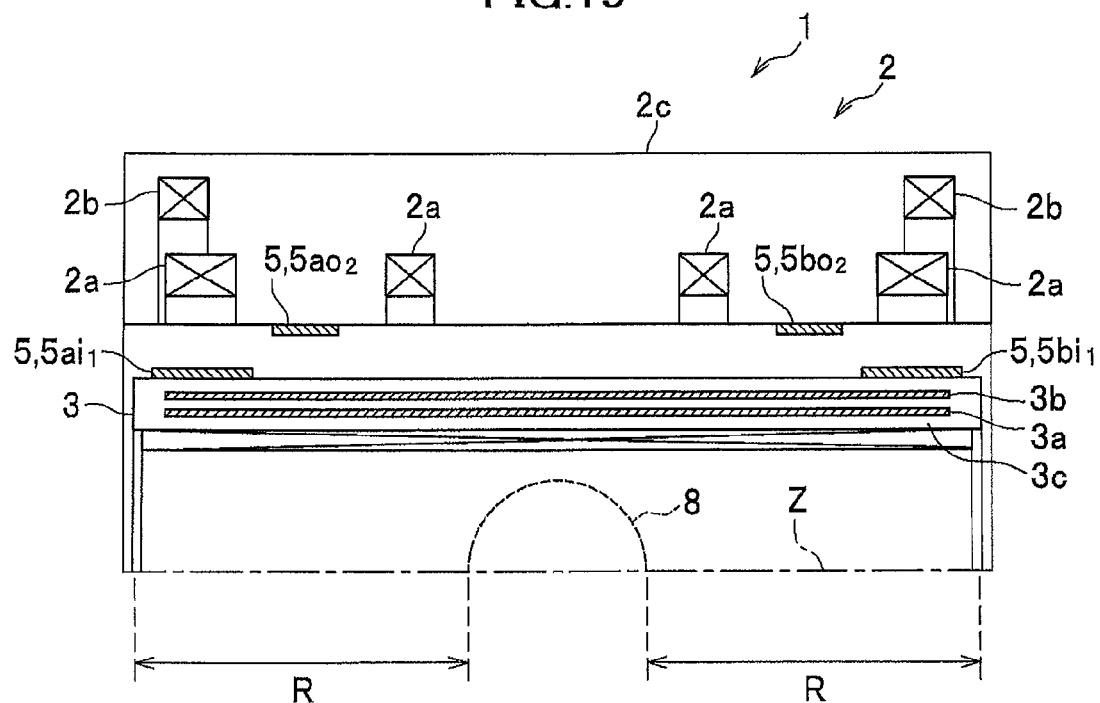
FIG. 19 is a schematic drawing illustrating a part above a z axis of an elevation cross section view of an MRI device according to an eleventh embodiment of the present invention.

FIG. 19 shows a schematic drawing illustrating a part above a z axis of an elevation cross section view of an MRI device according to an eleventh embodiment of the present invention. The MRI device 1 according to the eleventh embodiment is different from the MRI device 1 according to the fifth embodiment in that the first conductor rings $5ai1$, $5bi1$ ($5ai$, $5bi$ (see fifth embodiment and FIG. 9)) mechanically (without relative position change) connected to the gradient magnetic field generating device 3 and the second conductor rings $5ao2$, $5bo2$ ($5ao$, $5bo$ (see the fifth embodiment and FIG. 9)) do not face each other.

Accordingly, first conductor rings $5ai_1$, $5bi_1$ ($5ai$, $5bi$) are close to and face the static magnetic field generating device 2 second (the vacuum vessel $2c$). The second conductor rings $5ao_2$, $5bo_2$ ($5ao$, $5bo$) are close to and face the gradient magnetic field generating device 3. According to this, the residual magnetic field shielding effect described in the first embodiment can be more efficiently provided. In addition, because a first conductor rings $5ai_1$, $5bi_1$ and the second conductor rings $5ao_2$, $5bo_2$ do not face each other, gaps between the static magnetic field generating device 2 and the gradient magnetic field generating device 3 can be made small. In addition, it is desirable that width in z-axial of the first conductor rings $5ai_1$, $5bi_1$ are wider than the second conductor ring $5ao_2$, $5bo_2$. More specifically, it is desirable that (width of the first conductor ring $5ai_1$)>(width of second conductor rings $5ao_2$) and (width of first conductor ring $5bi_1$>(width of second conductor ring $5bo_2$)).

(Twelfth Embodiment)

Figure 20:
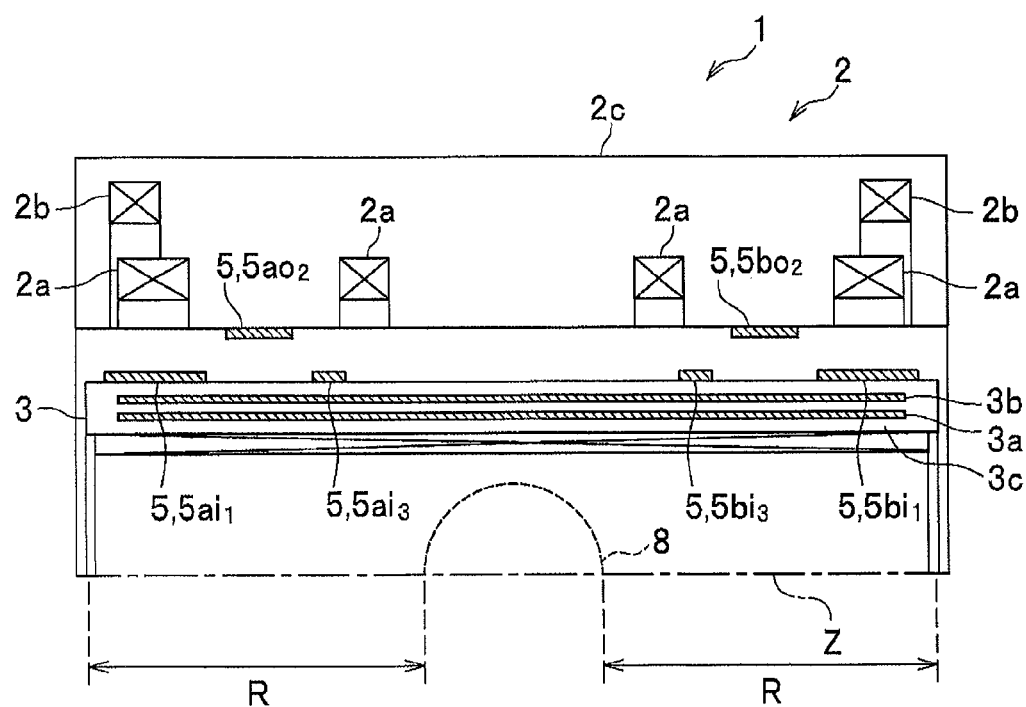
FIG. 20 is a schematic drawing illustrating a part above a z axis of an elevation cross section view of an MRI device according to a twelfth embodiment of the present invention.

FIG. 20 is a schematic drawing illustrating a part above a z axis of an elevation cross section view of an MRI device 1 according to a twelfth embodiment of the present invention. The MRI device 1 according to the twelfth embodiment is different from the MRI device 1 according to the eleventh embodiment is in that a plurality of the first conductor rings $5ai_1$, $5ai_3$, and the first conductor rings $5bi_1$, $5bi_3$ are installed in the pair of the arranging regions R, respectively. However, the arrangement is not limited to this, but a plurality of the second conductor rings $5ao_2$ and $5bo_2$ may be arranged in the pair of the arranging regions R, respectively. The first conductor rings $5ai_1$, $5ai_3$, $5bi_1$, $5bi_3$ and the second conductor rings $5ao_2$, $5bo_2$ are alternately arranged in the z axis. It is desirable that the more remote in the z axis from the imaging space 8 the plurality of conductor rings $5ai_1$, $5ai_3$, $5bi_1$, $5bi_3$, $5ao_2$, $5bo_2$ are, the larger the widths of the conductor rings $5ai_1$, $5ai_3$, $5bi_1$, $5bi_3$, $5ao_2$, $5bo_2$ are, i.e., ((width of the first conductor ring $5ai_1$)>(width of the second conductor ring $5ao_2$)>(width of the first conductor ring $5ai_3$) and (width of the first conductor ring $5bi_1$)>(width of the second conductor ring $5bo_2$)>(the first conductor ring $5bi_3$)). Because the arrangement can generate the eddy currents in a broader area, the vibration suppression effect can be further enhanced.

Further, in the first to twelfth embodiments, the superconducting coils are exemplified as the main coils $2a$ and $2b$. However, the present invention is not limited to this. As static magnetic field generating sources $2a$ and $2b$, a resistive coil or a permanent magnet can be used.

DESCRIPTION OF REFERENCE SYMBOLS 1 magnetic resonance imaging device
2 static magnetic field generating device
2a static magnetic field generating source (main coil)
2b static magnetic field generating source (shield coil)
2c vacuum vessel (outer wall of static magnetic field generating device)
2d radiation shield plate
2e cooling vessel
2f vacuum vessel supporting leg
3 gradient magnetic field generating device
3a gradient magnetic field generating source (main coil)
3b gradient magnetic field generating source (shield coil)
3c resin
4 radiation coil
5, 5a, 5b conductor ring
$5ai_{(1, 2, 3)}$, $5bi_{(1, 2, 3)}$ first conductor ring
$5ao_{(1, 2, 3)}$, $5bo_{(1, 2, 3)}$ second conductor ring
$5am_{(1, 2, 3)}$, $5bm_{(1, 2, 3)}$ third conductor ring
6 bed
7 homogeneous magnetic field
8 imaging space
9 gradient magnetic field
10 object body
11 elastic member
22 receiving coil
R arranging region

The invention claimed is:

1. A magnetic resonance imaging device comprising a gradient magnetic field generating device, the gradient magnetic field generating device comprising:
  a gradient magnetic field generating source generating a gradient magnetic field in space; and
  conductor rings arranged on a side outside the gradient magnetic field generating source opposite to the space where the gradient magnetic field is generated, in a pair of arranging regions on both sides of a region of a homogenous magnetic field in a direction of the homogeneous magnetic field, respectively, the conductor rings being separated from each other and making a pair.

2. A magnetic resonance imaging device comprising:
  a static magnetic field generating device including a static magnetic field generating source generating a homogeneous magnetic field in a space;
  a gradient magnetic field generating device including a gradient magnetic field generating source superimposing a gradient magnetic field on the homogeneous magnetic field;
  conductor rings arranged between the static magnetic field generating source and the gradient magnetic field generating source in a pair of arranging regions on both sides, in a direction of the homogeneous magnetic field, of a region of the homogeneous magnetic field, respectively, the conductor rings being separated from each other and making a pair.

3. The magnetic resonance imaging device as claimed in claim 2, wherein a plurality of conductor rings are arranged in a pair of the arranging regions, respectively.

4. The magnetic resonance imaging device as claimed in claim 2, wherein conductor rings are mechanically connected to the gradient magnetic field generating device.

5. The magnetic resonance imaging device as claimed in claim 2, wherein conductor rings are mechanically connected to the static magnetic field generating device.

6. The magnetic resonance imaging device as claimed in claim 2, wherein conductor rings comprise:
  a first conductor ring mechanically connected to the gradient magnetic field generating device; and
  a second conductor ring mechanically connected to the static magnetic field generating device, arranged so as to face the first conductor ring, and insulated from the first conductor ring.

7. The magnetic resonance imaging device as claimed in claim 6, wherein conductor rings comprise a third conductor ring arranged between the first and second conductor rings and insulated from the first and second conductor rings.

8. The magnetic resonance imaging device as claimed in claim 6, further comprising an elastic body disposed between the first and second conductor rings.

9. The magnetic resonance imaging device as claimed in claim 2, wherein the conductor rings comprise:
  a first conductor ring mechanically connected to the gradient magnetic field generating device and arranged so as to face the static magnetic field generating device; and
  a second conductor ring mechanically connected to the static magnetic field generating device, arranged so as to face the gradient magnetic field generating device and not to face the first conductor ring, and insulated from the first conductor ring.

10. The magnetic resonance imaging device as claimed in claim 2, wherein the conductor ring has an electric resistivity per a unit plate thickness that is lower than an electric resistivity of an outer wall of the gradient magnetic field generating device per unit plate thickness.

11. A magnetic resonance imaging device comprising a static magnetic field generating device, the static magnetic field generating device comprising:

a static magnetic field generating source generating a homogeneous magnetic field in a space; and conductor rings arranged on a side outside the static magnetic field generating source, the side being opposite to the space where a gradient magnetic field is generated, in a pair of arranging regions on both sides in a direction of the homogeneous magnetic field of a region of the homogeneous magnetic field, respectively, the conductor rings being separated from each other and making a pair.

* * * * *